United States Patent [19]

Freeman et al.

[11] Patent Number: 5,964,708
[45] Date of Patent: Oct. 12, 1999

[54] BEAMFORMED ULTRASONIC IMAGER WITH DELTA-SIGMA FEEDBACK CONTROL

[75] Inventors: Steven R. Freeman; Matthew O'Donnell, both of Ann Arbor, Mich.; Thomas E. Linnenbrink, Monument, Colo.; Marc A. Morin, Woodland Park, Colo.; Marshall K. Quick, Colorado Springs, Colo.; Charles S. Desilets, Edmonds, Wash.

[73] Assignees: The Regents of the University of Michigan, Ann Arbor, Mich.; Q-Dot, Inc., Colorado Springs, Colo.

[21] Appl. No.: 08/944,226

[22] Filed: Oct. 6, 1997

[51] Int. Cl.$^6$ ........................................... A61B 8/12
[52] U.S. Cl. ........................................... 600/447; 341/155
[58] Field of Search ........................ 600/437, 441, 600/447; 341/131, 155; 395/800; 73/625

[56] References Cited

U.S. PATENT DOCUMENTS

| | | | |
|---|---|---|---|
| 4,772,871 | 9/1988 | Suzuki et al. | 341/155 |
| 5,144,308 | 9/1992 | Norsworthy | 341/131 |
| 5,203,335 | 4/1993 | Noujaim et al. | 128/661.01 |
| 5,241,310 | 8/1993 | Tiemann | 341/143 |
| 5,446,917 | 8/1995 | Krisciunas et al. | 395/800 |
| 5,461,389 | 10/1995 | Dean | 342/375 |
| 5,477,859 | 12/1995 | Engeler | 128/661.01 |
| 5,668,777 | 9/1997 | Schneider | 367/96 |

OTHER PUBLICATIONS

Norman, O., A Band–Pass Delta–Sigma Modulator for Ultrasound Imaging at 160 MHZ Clock Rate, 31(12) IEEE Journal of Solid–State Circuits 2036–41 (Dec., 1996).

Baseri, R., et al., Testing Adaptive Jamming Cancellation Algorithms using a Digital Beamforming Array, Proceedings of the 1997 IEEE National Radar Conference (May 13–15, 1997).

*Primary Examiner*—Marvin M. Lateef
*Assistant Examiner*—Ali M. Imam
*Attorney, Agent, or Firm*—Welsh & Katz, Ltd.

[57] ABSTRACT

A method and apparatus are provided for reducing distortion in a dynamically delayed digital sample stream of an imaging system. The method includes the steps of delta-sigma modulating an input analog signal of the imaging system at a frequency above the Nyquist frequency of the input analog signal to generate a digital sample stream and changing a length of the sample stream to delay a portion of the sample stream while maintaining synchronism between a delta-sigma modulator and a demodulator of the system.

31 Claims, 27 Drawing Sheets

ULTRASONIC IMAGING SYSTEM BLOCK DIAGRAM

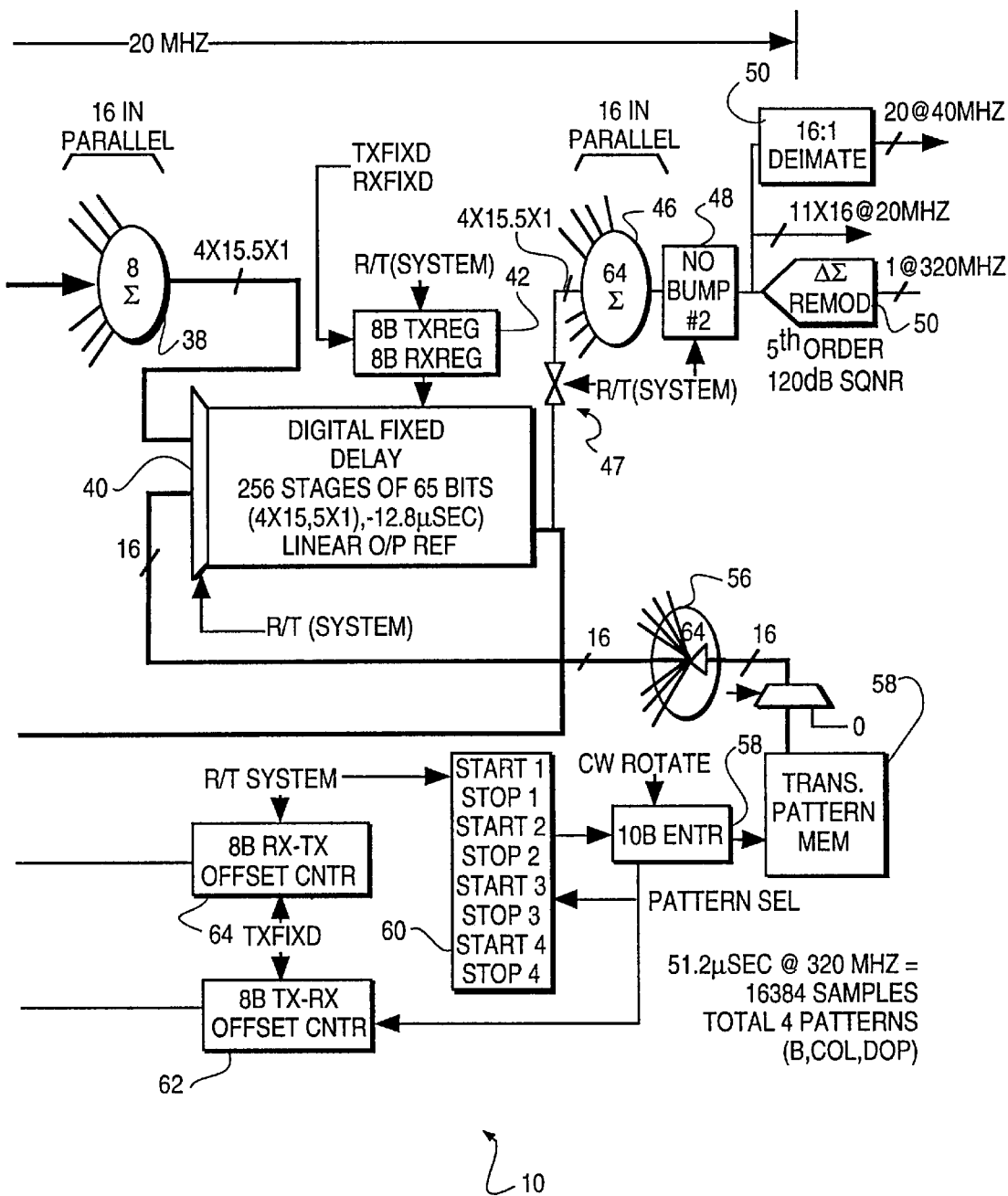

FIG. 9
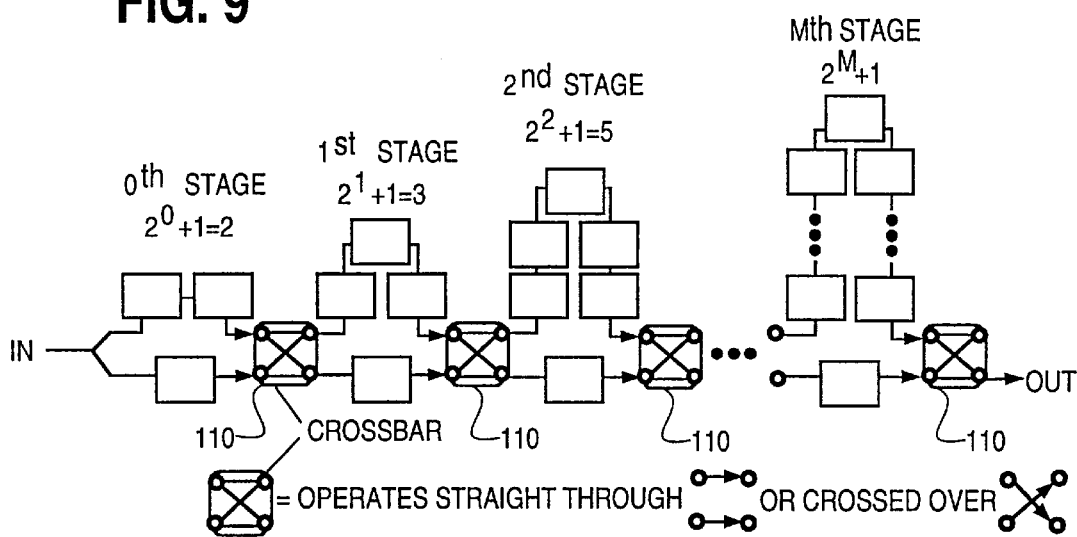
FIG. 10A
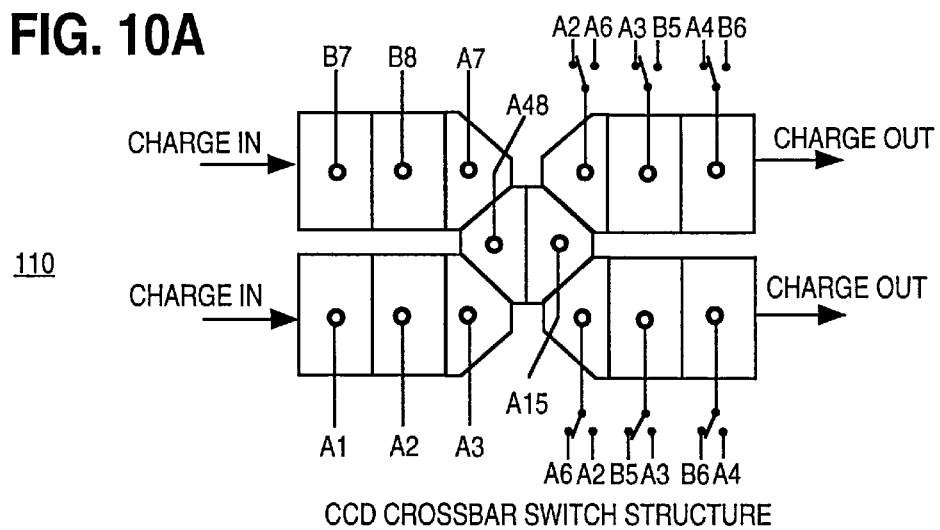
CCD CROSSBAR SWITCH STRUCTURE
FIG. 10B
| A1 | A2 | A3 | A4 | A5 | A6 | A7 | A8 | B5 | B6 | B7 | B8 | A48 | A15 |
|----|----|----|----|----|----|----|----|----|----|----|----|-----|-----|
| 1  | 1  | 0  | 0  | 0  | 0  | 0  | 0  | 1  | 1  | 1  | 1  | 0   | 1   |
| 0  | 1  | 1  | 0  | 0  | 0  | 0  | 0  | 1  | 1  | 1  | 1  | 1   | 0   |
| 0  | 0  | 1  | 1  | 0  | 0  | 0  | 0  | 1  | 1  | 1  | 1  | 0   | 1   |
| 0  | 0  | 0  | 1  | 1  | 0  | 0  | 0  | 0  | 1  | 1  | 1  | 1   | 0   |
| 0  | 0  | 0  | 0  | 1  | 1  | 0  | 0  | 1  | 0  | 1  | 1  | 0   | 1   |
| 0  | 0  | 0  | 0  | 0  | 1  | 1  | 0  | 1  | 1  | 0  | 1  | 1   | 0   |
| 0  | 0  | 0  | 0  | 0  | 0  | 1  | 1  | 1  | 1  | 1  | 0  | 0   | 0   |
| 1  | 0  | 0  | 0  | 0  | 0  | 0  | 1  | 1  | 1  | 1  | 0  | 1   | 1   |
CLOCK PATTERN

BARREL SHIFT TECHNIQUE

CASCADED TGC STAGES TECHNIQUE

N - DIGITAL CONTROL WORD

FIG. 33A
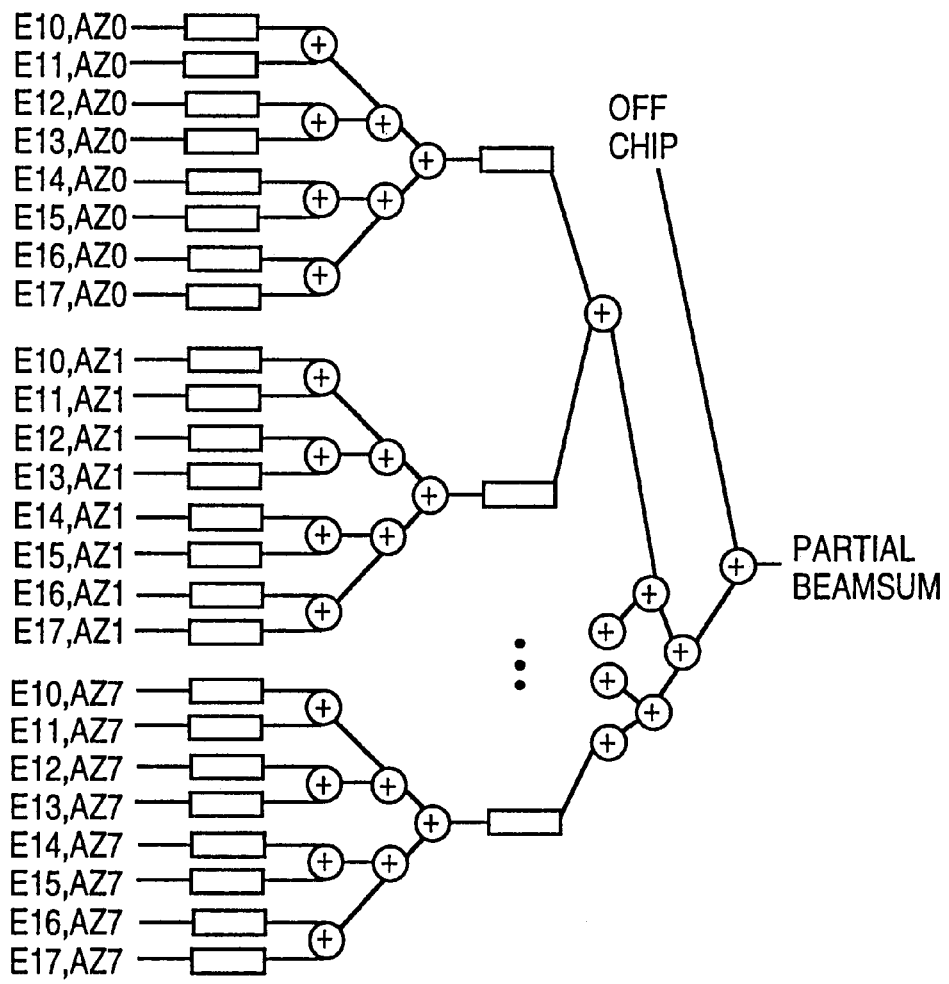
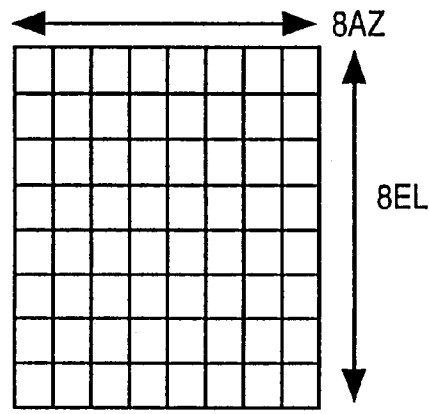
NORMAL BEAMFORMER

FIG. 33B
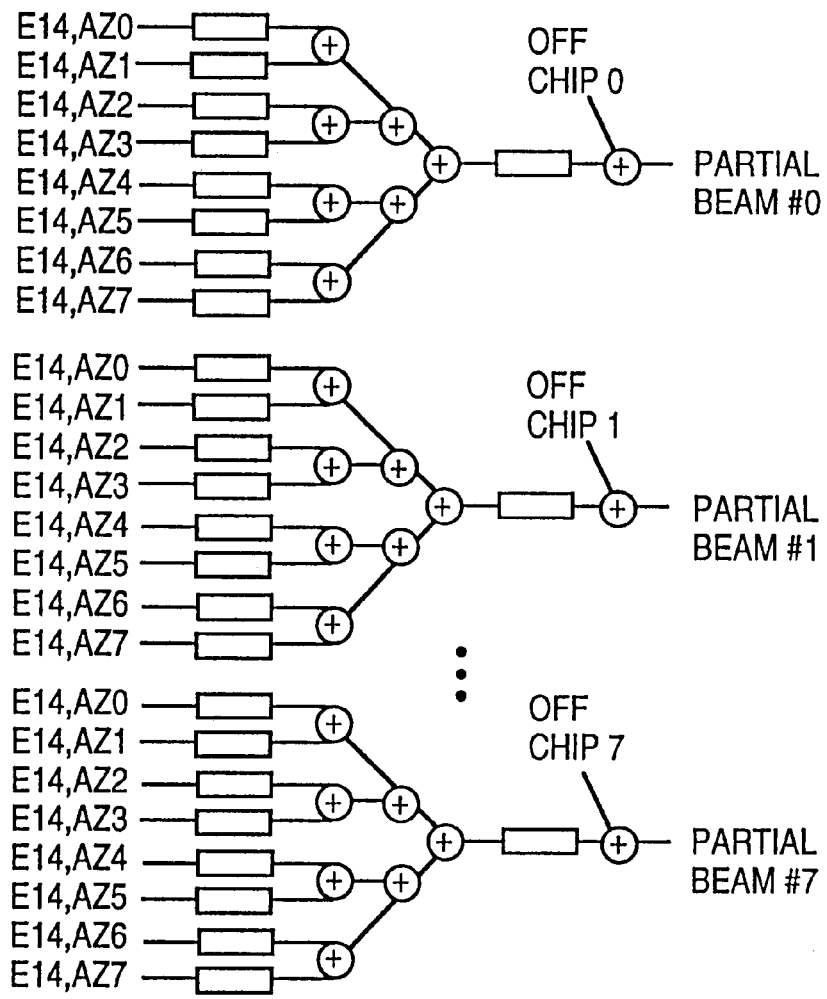
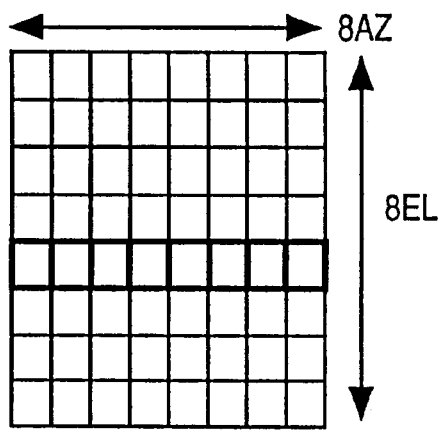
MULTIBEAM BEAMFORMER 34, 40

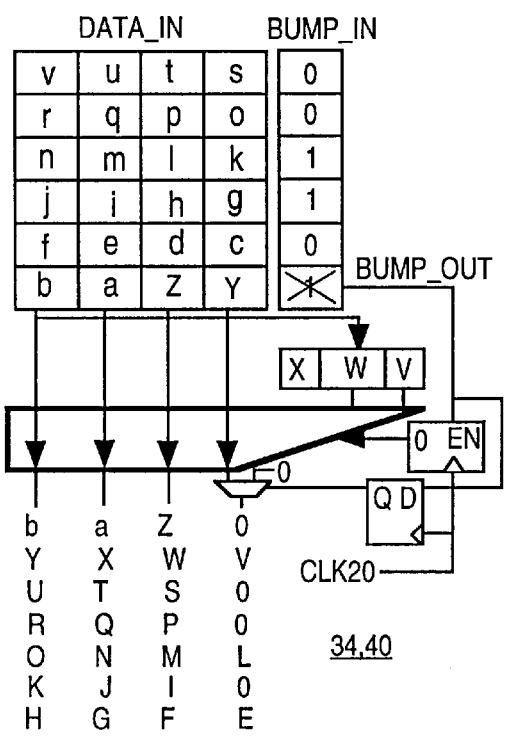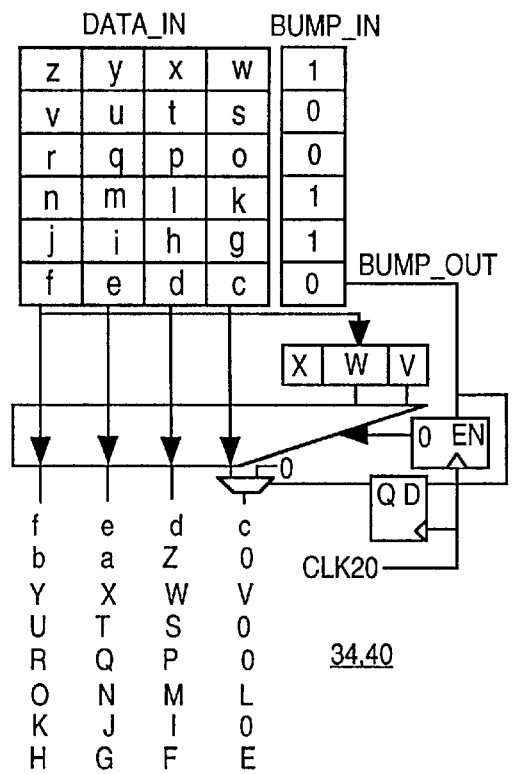

UNSIGNED:

SIGNED:

UNSIGNED:

SIGNED:

BEAMFORMED ULTRASONIC IMAGER WITH DELTA-SIGMA FEEDBACK CONTROL

FIELD OF THE INVENTION

The invention relates to ultrasonic imaging and more particularly to delta-sigma modulation of an ultrasonic imaging signal.

I. BACKGROUND

Many coherent array systems (acoustic or electromagnetic) use some form of dynamic focusing to generate images with diffraction limited resolution. Examples include ultrasound, sonar, and RADAR. The remainder of this disclosure will be focused primarily on ultrasound applications; however, the principles can be applied to sonar, RADAR or any coherent array imaging system as well.

Current clinical ultrasound systems generate images of soft tissue within the body by launching a vibratory pulse and then receiving and processing the reflected energy. The transmitted vibratory pulse is often limited to a single focus along a particular steering angle for each firing. In contrast, reflected signals are continuously recorded permitting array refocusing on receive. Dynamic receive focusing is accomplished by changing individual channel delays with time (range) prior to summing the RF signal over all elements to form the received beam.

A complete state-of-the-art ultrasound imaging system uses a large collection of application specific integrated circuits (ASICs), digital signal processors (DSPs), microcontrollers ($\mu$C), memory buffers, etc... integrated onto a set of printed circuit boards connected by a modified communications bus (usually a VME bus). FIG. 1 generally shows a block diagram of the various processing elements providing the wide ranging capabilities clinicians expect today from a high quality ultrasound imager. The front-end processor, and more specifically the beamformer, will be the primary focus of this disclosure. Significant prior art exists for different beamforming architectures as well as different implementations of downstream processing elements, such as Doppler and color flow processors.

State-of-the-art systems employ a beamforming scheme similar to that shown in FIG. 2, where a high speed, multi-bit analog to digital converter on each channel samples the incoming ultrasound signal. These samples are then delayed by one of several means before being summed within a pipelined set of digital adders. The delay structure compensates for the channel's geometric position relative to the desired receive focus. Properly delayed signals yield coherent interference when summed across the array. These delays, however, must change as the transmitted pulse propagates into tissue. Dynamically changing delays are difficult to implement, and there is considerable prior art which documents various methods used to date. Older systems (until 1980 or so) used analog delays and sums which suffered from signal to noise and temperature drift problems adversely affecting image quality. Current fully digital systems provide greatly improved quality; however, the required beamforming and processing hardware is extensive, expensive, and consumes significant power.

The system proposed under this invention solves these problems using oversampled delta-sigma modulation and dynamic delay for beamforming a received image. Feedback control within the delta-sigma modulator or recoding the digital outputs reduces distortion introduced by changes in dynamic delay.

The basic oversampled approach of the invention has been further improved through premodulation, whereby bandwidth can be effectively traded-off with quantization noise. Also, multiple stages of beamforming are included so that two dimensional arrays can be used effectively. One delay stage is used for elevational beamforming, and the other for azimuthal. Finally, correct transmit phasing can, for the first time, be performed using existing receive phasing circuitry, thus reducing system complexity and power consumption.

II. SUMMARY OF THE INVENTION

An apparatus and method are provided for compensating a dynamically delayed signal stream for distortion in a delta-sigma ($\Delta\Sigma$) modulator of an imaging system. The method includes the steps of changing a length of a portion of the bit stream being generated by the delta-sigma modulator and either adjusting a feedback magnitude of the delta-sigma processor or recoding the manipulated digital signal sample to compensate for the changed delay.

An overview of the system will be presented first describing the components and operation of the oversampled receive beamformer. Using these components for transmit purposes will also be briefly discussed. Issues related to the $\Delta\Sigma$ analog to digital converter (A/D) and its use in the system will be presented in detail. Measures to improve its performance will also be presented. Other important details of the system will be described including methods to apodize the array, delay the sample stream, and perform necessary arithmetic.

This section will repeatedly refer to FIG. 3, showing a system-level schematic of the proposed beamformer. A general discussion will be provided here of transmit and receive operation. It will be expanded in the following two sections to include a detailed description of each of the functional elements. For illustration, we assume the active transducer is a 1.5-D array of 64×8 elements sequentially stepped in azimuth across a total array of 192×8 elements, thereby sweeping out a linear sector (for a flat array) or an offset sector (for a curved array). Please note that the specific strategy presented for this system can be easily modified for any arbitrary array geometry.

In the discussions presented throughout this disclosure, there are specifics presented that could easily be modified. The number of elevational elements in the array, for instance, is variable, so that 7 elements could be used instead of 8. The following is a list of system parameters that should be considered variable:

Array geometry and configuration—affects the scanning modes and magnitude of delays required for proper beamforming.

Transmit sample rate—affects signal to quantization noise (SQNR) of the transmitted signal as well as pattern memory size and datapath bandwidth requirements Receive sample rate—affects the SQNR of the digitized signal, set by the $\Delta\Sigma$ modulator. Also affects the clock rates and datapath width of the system.

Parallel-Serial and Serial-Parallel—circuits are used throughout the system to change the clock rates and bit-widths of the data. All such circuits could be implemented to provide different clock ratios of parallel to serial conversion, and visa-versa.

$\Delta\Sigma$ modulator order—affects the SQNR of the digitized signal. A higher order modulator has better noise shaping but involves more complicated circuitry.

$\Delta\Sigma$ quantizer bits—affects the SQNR of the digitized signal as well as the stability of the modulator. The datapath bandwidth also depends on this.

All of these items will be discussed with a specified embodiment in mind; however, all of them can be changed depending on design tradeoffs.

II.1. Transmit Beamformer (Tx)

Generating an ultrasound transmit (Tx) beam requires that a transmit pulse waveform be appropriately delayed to drive each transducer element in the 1.5-D array. In our system, the waveform is stored in a transmit pattern memory common to the entire system. The pulse waveform is coded using a $2^{nd}$ order, two level, delta-sigma digitization scheme operating at a nominal 320 MHz sampling rate, where data can be represented (and stored) using only one bit per sample. Data are read out of the memory several samples (e.g., 16) at a time at $\frac{1}{16}$ the Tx sampling rate and fed to a 64:1 splitter buffering it to 64 different digital delay structures. Data are shifted at $\frac{1}{16}$ the sampling rate into the delay structure. Each azimuthal channel delay structure has an independent setting allowing 4096 different delays to be applied to the transmit waveform, for azimuthal steering and focusing for example. Delay granularity is 16 times the Tx sampling period because changing the input tap position by one sample actually changes the transmit delay by sixteen 1-bit samples.

Following delay for each of the 64 azimuthal channels, transmit data are split/buffered to 8 different digital delay structures for each of the elevational channels (i.e. 512 total channels). This second digital shift register and parallel to serial (P:S) circuit apply a second delay. The delay granularity here, provided by the P:S, is equal to the sampling period. The independent delay applied to each of the 512 channels fine tunes the azimuthal focus, and also applies elevational steering and focus delays. Both sets of delays are fixed because the transmit focus is fixed in space.

Appropriately delayed per-channel transmit data are converted from a two-level, 1 bit digital representation into an analog voltage. This analog signal is then lowpass filtered with a relatively simple FIR filter structure to reduce delta-sigma modulation noise. A per-channel, three bit (8 level) apodization multiplier is also applied to the analog signal to manipulate transmit beam sidelobes. The analog signal is then amplified by a differential high voltage power amplifier to drive the transducer element with up to +−66 V. The Transmit/Receive (T/R) analog switch and azimuthal analog multiplexer connect the power amplifier with the appropriate transducer array element.

II.2. Receive Beamformer (Rx)

After launching the transmit pulse, the T/R switch toggles on each channel to connect the receive circuitry to the transducer array element. Each of the 512 channels passes the received signal through low noise amplifier (LNA) and Time Gain Compensation (TGC) amplifier. The TGC amplifier has variable gain and compensates for the exponential attenuation of the ultrasound signal as a function of tissue depth. The amplified signal is next digitized using a premodulated $3^{rd}$ order delta-sigma modulator running at a sampling rate of 320 MHz. This element will be discussed in substantial detail later. Simply stated, however, it takes the analog input and generates a single bit (+−1 level) delta-sigma modulated digital output. The receive apodizer, integrated with the modulator input, generates a zero level input while the channel is turned off (to meet a minimum F/number criterion) and otherwise passes the premodulated IF signal to the delta-sigma digitizer. The single bit output of the digitizer can be converted from a 320 MHz rate signal (for example) into a 16-parallel-bit word at 20 MHz (1:16 serial to parallel conversion- S:P). For these reduced clock rate delay lines, additional circuits are required in conjunction with the delays to provide the necessary wavelength/32 delay resolution.

The digital delay line following the $\Delta\Sigma$ modulator/apodizer is designed to accept the word widths and clocking rates produced by the optional serial to parallel conversion. These structures apply the following types of delays, which are all cumulative:

1) Dynamic delays for elevational focusing at every point along the beam.
2) Static delays for elevational steering of the beam.
3) Dynamic delays for azimuthal focusing at every point along the beam.
4) Small static delays to fine tune azimuthal beam steering.

The method of changing delays is an important aspect of the system discussed at length later. For now, one can assume that the dynamic delay line correctly extends the length of the sample stream so that delay types 1 & 3 are applied as a function of range and types 2 & 4 are fixed presets. Control circuitry associated with the delay lines includes a finite state machine calculating when delays should change to maintain both elevational and azimuthal focus (more on this later). Once the received signal is delayed, a sum is performed across the eight elevational elements. If a S:P conversion increases the bit-width of the delay line, then several eight-input sums may take place at the same time. Each summation will likely be implemented in a pipelined and parallel manner because of the high sampling rate and number of inputs. A 5-bit output of each addition may be used to feed a filter and decimate circuit creating a 13 to 20-bit output at $\frac{1}{4}$ to $\frac{1}{16}^{th}$ the Rx sampling rate (e.g. 20 MHz). Means for filtering and decimation will be discussed later; however, the reason for incorporating this stage is to reduce the clock rate of all subsequent stages. Reducing the clock rate reduces both the number of delay stages and the power consumed by each stage, resulting in a quadratic reduction in overall power consumption. The 5-bit undecimated or 13 to 20-bit decimated words from each elevational sum are delayed by fixed amounts through the second digital shift register to synthesize azimuthal steer and static focus. A final pipelined addition of the 64 azimuthal channels completes the receive beamforming operation, yielding a multibit digital value at $\frac{1}{16}$ the sampling rate. This digital signal can be communicated directly to other processing circuitry for scan conversion, Doppler processing, and display. Alternatively, a high order delta-sigma converter could be used to convert the 22-bit digital value to a single high bit rate signal which can be communicated optically or via RF-link to other processing circuitry.

SUMMARY

A method and apparatus are provided for reducing distortion in a dynamically delayed digital sample stream of an imaging system. The method includes the steps of delta-sigma modulating an input analog signal of the imaging system at a frequency above the Nyquist frequency of the input analog signal to generate a digital sample stream and changing a length of the sample stream to delay a portion of the sample stream while maintaining synchronism between a delta-sigma modulator and a demodulator of the system.

BRIEF DESCRIPTION OF THE DRAWINGS

FIG. 9 depicts a digital delay of FIG. 3 under an alternate embodiment showing a complementary delay line using a gray-code crossbar network;

FIGS. 10A–B depicts a digital delay of FIG. 9 showing a structure and clock pattern of a CCD crossbar implementation;

FIGS. 33A–B depicts a modification of the beamformer of FIG. 3 allowing multiple receive beams to be formed simultaneously;

FIGS. 37A–B depicts a further continuation of the examples of FIG. 36;

III. DETAILED DESCRIPTION

The U.S. Government has a paid-up license in this invention and the right in limited circumstances to require the patent owner to license others on reasonable terms as provided for by the terms of ONR Contract No. N00014-96-C-0191 awarded by DARPA.

III.0 The Transmit Components

Figure 1:
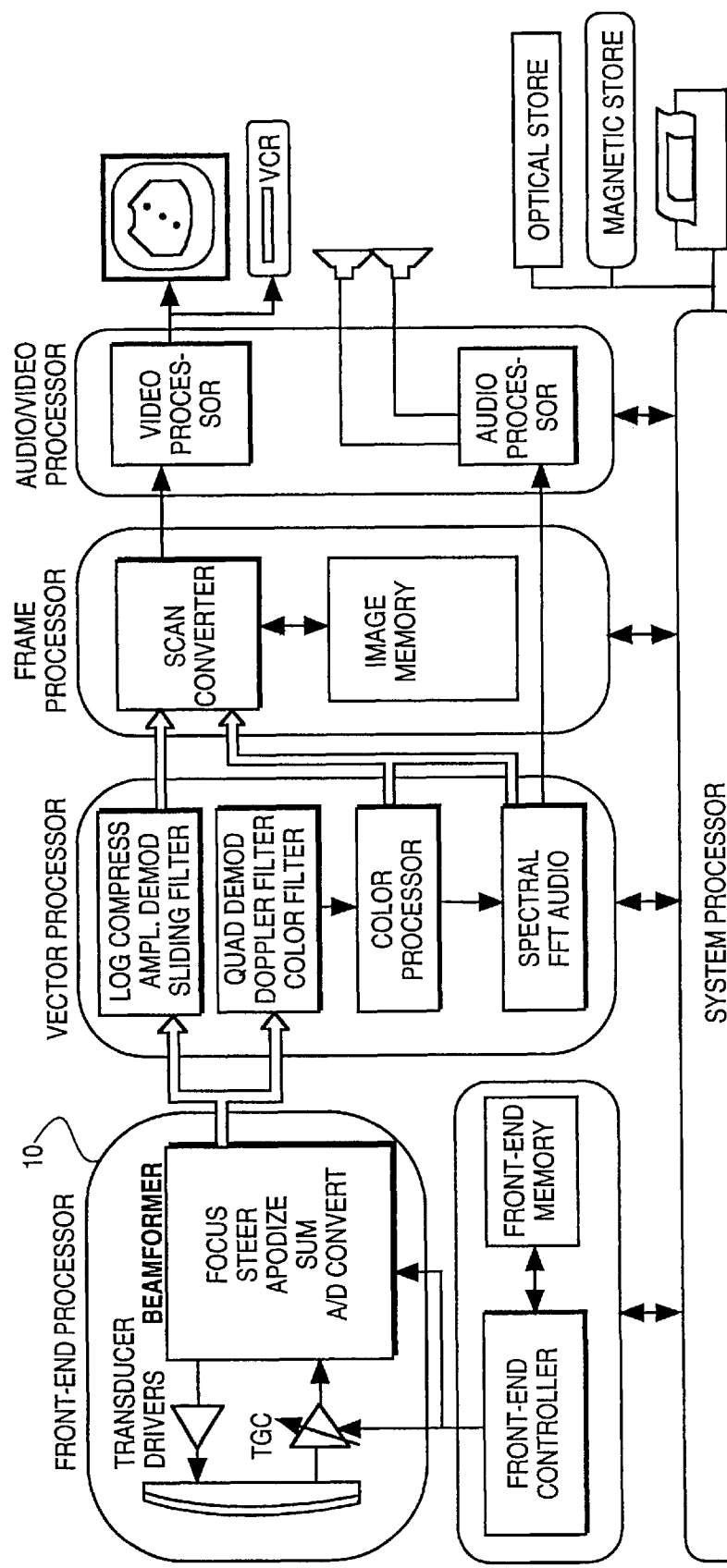
FIG. 1 depicts a block diagram of an ultrasonic imaging system in accordance with an illustrated embodiment of the invention.
Figure 2:
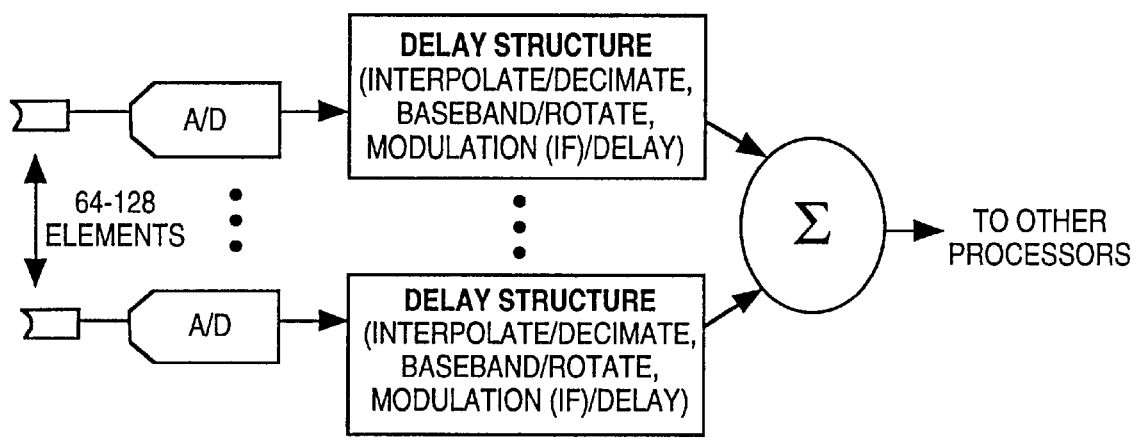
FIG. 2 is a block diagram of a prior art beamforming processor.
Figure 3:
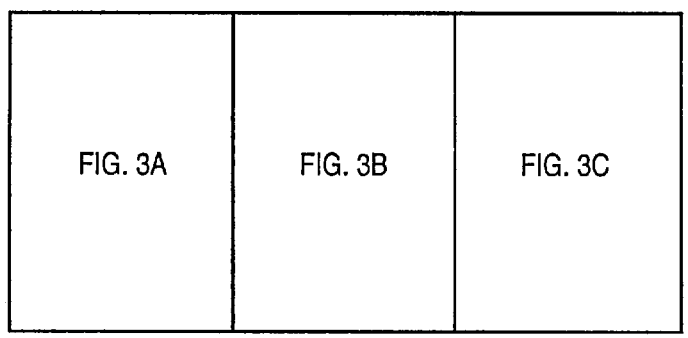
FIG. 3 depicts a block diagram of the front end processor of FIG. 1.
Figure 3A:
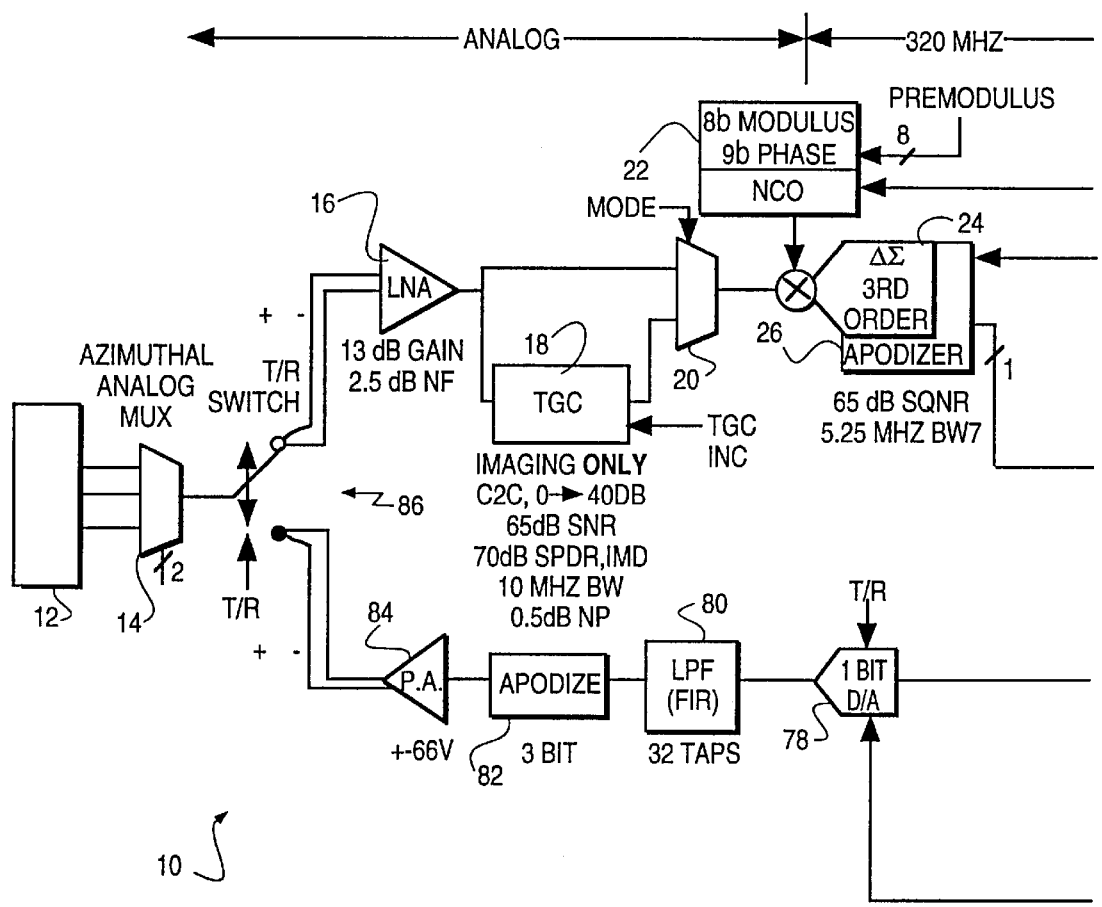
Figure 3B:
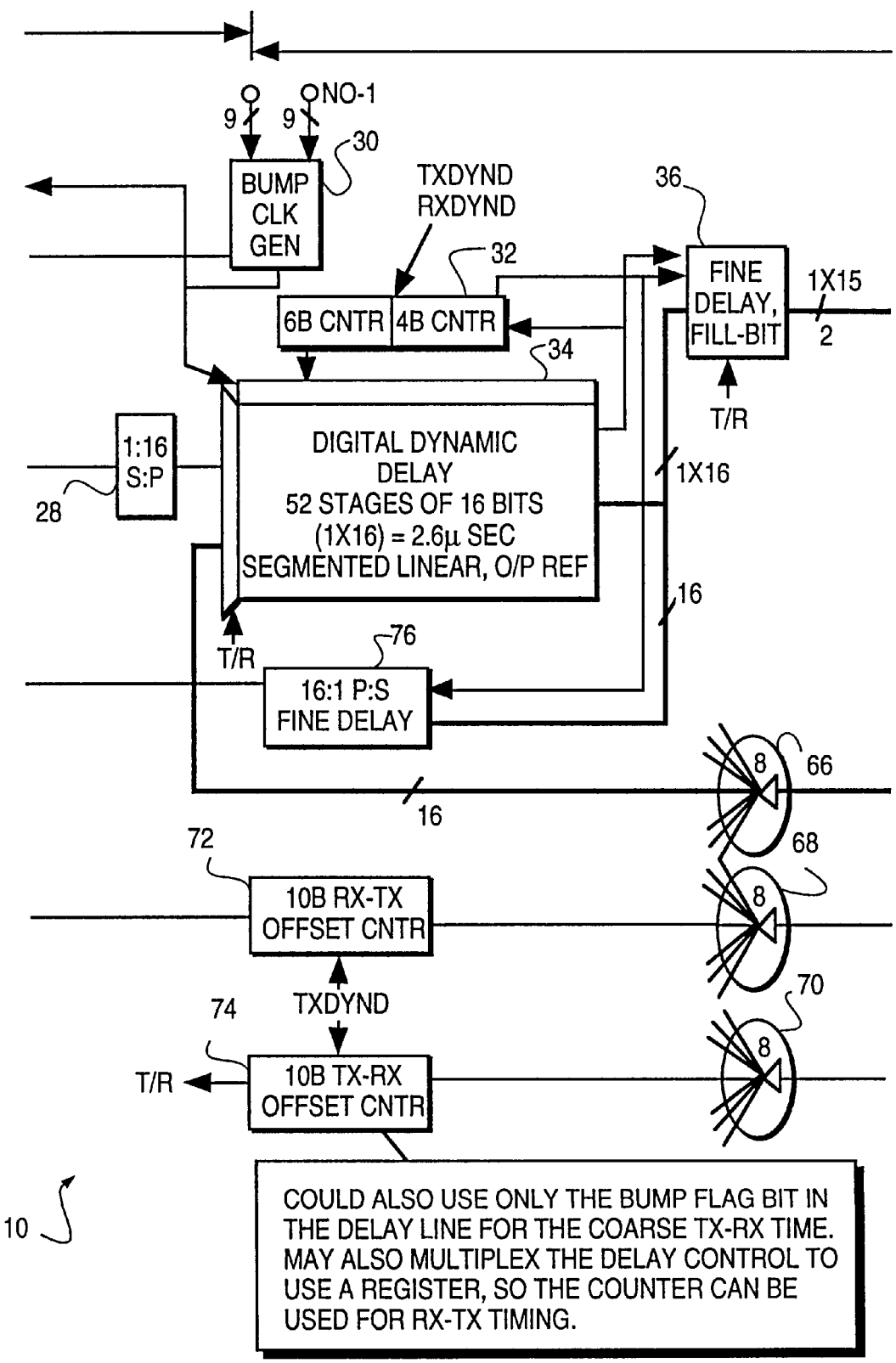

This section discusses in detail transmit beamforming elements of the beamforming system 10 of FIG. 3 of the ultrasonic imaging system of FIG. 1. In many ways, transmit operation of the beamforming system 10 is more straightforward and simpler to understand than receive, and consequently is presented first. Section IV will present the receive components of this invention. Some components are used both for transmit and receive (the most significant of these being the delay structures). They will be presented here rather than in section IV.

III.1. The Array:

The two dimensional array 12 of acoustic transducers consists of 192 azimuthal elements by 8 elevational elements. Of the 192 azimuthal elements, only a subaperture of 64 will be active for any transmit and receive beam. The active aperture, therefore, is 64 azimuthal by 8 elevational elements, yielding a total active channel count of 512. Stepping this 64 element subaperture across the 192 element array in azimuth for each beam will produce a set of beams scanning a plane within the field of interest. The array surface can be flat or curved, resulting in a linear or offset sector scan.

Although the beamforming system 10 presented here is designed for such an array, it is not restricted to it. That is, the beamforming hardware can be easily modified, primarily at the front-end analog mux 14, to perform equally well for any array configuration. This particular configuration was chosen to provide the best image quality with 512 active channels. The beamformer can be expanded or condensed arbitrarily depending on the array type for a particular application.

III.2. Transmit Pattern Memory

The transmit pattern memory 54 is located physically close to or integrated within the beamformer 10. A 2-kilobyte SRAM can store at least four, 12.8 $\mu$sec pulse waveforms sampled at 320 MHz using a 1-bit delta-sigma modulation code. This code will be read out at least 8 words at a time to relax memory access time constraints, (i.e. 40 MHz readout). A possible 2-bit code has three output levels as follows:

00-Level 0
01-Level +1
10-Reserved (T/R switch control)
11-Level−1

Note that the '10' code is reserved for control (to be discussed in section III.5). A 1-bit code uses a straight forward mapping of the 0 and 1 codes to a −1 and +1 level, respectively. At least four different transmit patterns are stored within the memory 54 for B-mode, Color Flow, and Doppler modalities. Each mode requires a transmit burst with different signal bandwidths, thus at least three distinct patterns are required. At the end of a receive beam, the front-end controller asserts a signal to start the transmit cycle. The front-end drive circuitry, discussed in sections III.5–III.9, does not transmit until a set of offset counters 74, 62 indicates that valid transmit data have made it through the delay lines. When the front-end controller signals the start of transmit, a counter 58 increments the 2 to 4 kilobyte memory 54 from a starting offset address to a termination address. The transmit memory outputs the appropriate samples and stops (under normal circumstances).

The disclosed beamformer 10 can also support a fourth modality. Continuous Wave (CW) Doppler uses continuous, appropriately phased RF signals to form a low spatial resolution, high Doppler sensitivity focus within the tissue. With our proposed transmit signal generation circuitry, the transmit pattern memory must be loaded with a single transmit pattern and then circularly addressed to produce a CW signal. At the end of the encoded (stored) transmit sequence, the address counter resets to zero and continues to address the memory repeatedly, thereby synthesizing a continuous RF signal. In this mode, some channels will be used for transmit and others for receive. This does not affect the transmit pattern memory 54; however, the T/R switches 47, 86 must be set appropriately throughout the system to specify the operation of each channel. Due to the shared nature of the fixed delay lines, all elevational elements for a particular azimuthal column will operate in the same mode, either transmit or receive. Also, during CW operation the transmit pattern could be a square wave driving pattern rather than a $\Delta\Sigma$ encoded waveform. This simplifies the circular addressing of the memory because a $\Delta\Sigma$ pattern may not be exactly periodic.

III.3. Digital Fixed and Dynamic Delays

There are many ways to implement dynamic and fixed digital (or analog) delays 34, 40. This section discusses several of these mechanisms and briefly presents their strengths and weaknesses.

Figure 4:
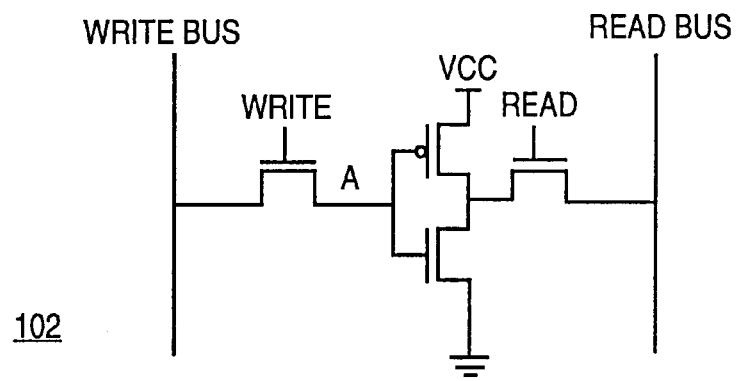
FIG. 4 depicts a schematic of a storage cell of a dynamic RAM based FIFO of the digital delay structure of FIG. 3.
Figure 6:
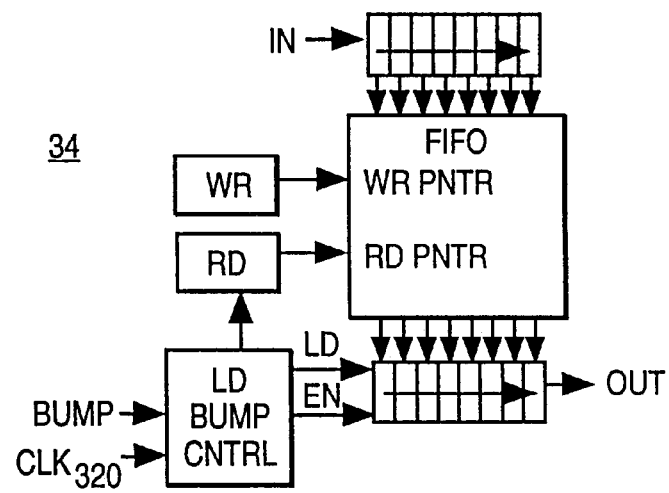
FIG. 6 depicts a digital delay under a shift register embodiment of the delay structures of FIG. 3.

The usual method of delaying a data stream under a first embodiment is to use a FIFO with separate write and read pointers addressing a circular memory buffer. As the delay increases, the spacing between read and write pointers increases until the entire FIFO length is used to store data (corresponding to the longest delay). Although a static FIFO memory can be used in our system, its size and power consumption at the high operating frequencies makes it a suboptimal solution. A standard dynamic RAM could be used as a FIFO; however, the read line sense-amps require special biasing of the substrate and other complex self-timed circuits. Another option under an illustrated embodiment is to use a storage cell 102, shown in FIG. 4, with a dynamic storage node at point A and a tristate buffer connected to the output read line. This structure does not require sense-amps because the buffer in each cell is capable of driving the read line through a full logic transition. Precharging the read line could increase the speed of operation. Because data are not shifted on every clock cycle, as in the shift register implementations described below, this implementation may have lower power consumption than other methods. The power consumed by the address counters and decoding offset this power savings, however. An illustration of a FIFO based dynamic delay 34 is shown in FIG. 6.

Charge Coupled Devices (CCDs) have been used since the early 1970's to physically move charge from one point to another, (in addition to their extensive use as imaging devices). R. D. Melen et al. attempted analog ultrasound beamforming using CCDs; however, difficulties with clocking made the structure impractical. Today CCDs are capable of transporting approximately 60 dB dynamic range analog signals at operating frequencies above 200 MHz. They can easily transport the three level quantized output of the proposed delta-sigma modulator as a three level analog signal, rather than a two bit digital signal. The eight channel elevational sum can be an analog sum of the quantized delayed signals, yielding an analog signal with 17 possible levels (15 if only 7 elevational elements are used). The 64 channel azimuthal sum would bring the number of quantized levels to 1025 (897 for 7 EL channels), easily within the 60 dB SNR limit of the CCD. In short, all of the delay and sum operations proposed earlier as multi-bit digital implementations can be done with CCDs as quasi-analog (quantized analog voltage) operations. The delay lines, in this case, are variable length CCD shift registers and the summing junctions are common CCD nodes pooling together quantized charge "packets". This type of structure exhibits a certain elegance lost in a purely digital implementation. Specifically, the CCDs can be used to move, delay, and sum the delta-sigma quantized charge throughout the entire beamformer. However, this implementation requires considerable chip area because current CCD fabrication processes are limited to 1.2 $\mu$m minimum features, whereas standard CMOS processes are now available with 0.35 $\mu$m minimum features. As a result, standard CMOS delay line and summer implementations have been investigated as well.

Figure 5:
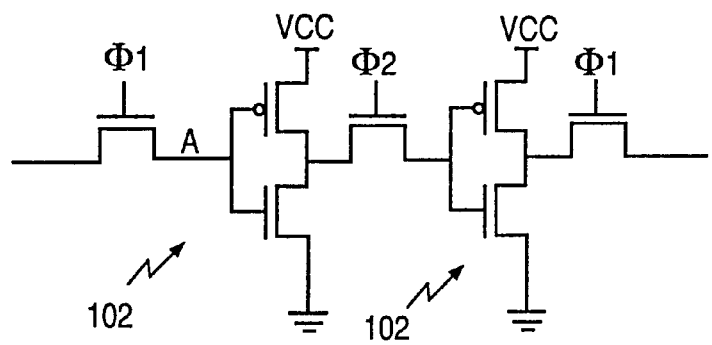
FIG. 5 depicts a storage cell for a dynamic shift register of the delay structures of FIG. 3.

Fixed and dynamic digital delays 40, 34 can be implemented using multi-bit CMOS shift registers of variable length. The continuous, high operating frequencies of the delay lines makes a dynamic CMOS shift register a preferred device for this application. That is, storage elements of the shift register need not be static (as in Static RAM) because dynamic storage on capacitors (as in Dynamic RAM) is sufficient given the operating frequencies. The simplest of these dynamic CMOS shift registers, shown in FIG. 5, uses six transistors per storage cell 102 (two cascaded inverters with a single transistor separating each stage), though many possible implementations exist.

Both CCD and CMOS shift registers shift data from input to output through a variable number of transport stages. The delay line structure must change the delay in response to a control signal. For fixed stages, the delay will only change from one beam to another. In contrast, dynamic delay stages (per channel) will change many times during one beam while data flow through it. There are many ways to do this, including the following:

1) a linear shift register with a variable input but constant output;
2) a linear shift register with a constant input and variable output;
3) a trombone shaped register with selectable turn-around points;
4) a complementary gray-code crossover network;
5) a segmented linear register with variable output or input.

There are many structures that would appropriately vary the apparent delay; however, those presented above will be discussed briefly to illustrate the diverse possibilities.

III.3.1. Linear shift register with variable input and constant output

Figure 7A:
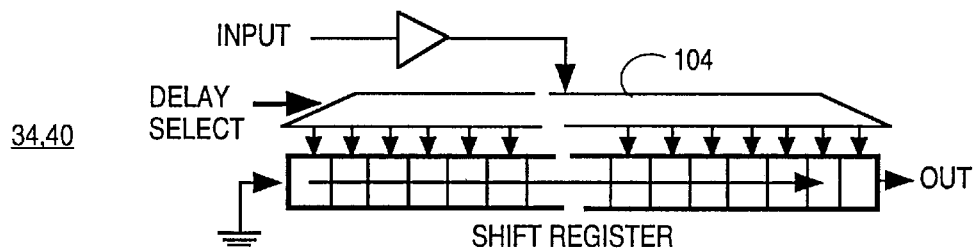
FIGS. 7A–B depicts a digital dynamic delay under an alternate embodiment of FIG. 3, using 7A: variable input and constant output, 7B: constant input and variable output.

FIG. 7A shows a CCD or CMOS linear shift register 34, 40 with selectable input position under another illustrated embodiment. The decoder/demultiplexer 104 selects which input will be used according to the control lines. The delay line output is just the output of the last delay stage. This structure has a very large fanout on the input line because it is common to every decoder element. For a CCD (quasi-analog) implementation the large fanout may be a problem because of the large analog buffers required. A CMOS implementation may require significant input buffering as well.

III.3.2. Linear shift register with constant input and variable output

Figure 7B:
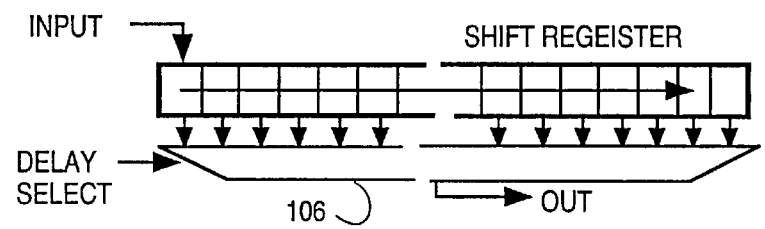

FIG. 7B shows a CCD or CMOS linear shift register 34, 40 with a single input and a multiplexer on each of the potential outputs under another illustrated embodiment. The multiplexer 106 selects which output will be buffered out of the structure, thereby selecting the delay through it. This structure has a similar fanout requirement as the previous one except that it's at the output. Each of the multiplexer outputs are tied together creating a very large output capacitance which the multiplexer cells must drive. Buffering these outputs may be a requirement in both CCD and CMOS implementations.

III.3.3. Trombone shaped register with selectable turn-around points.

Figure 8:
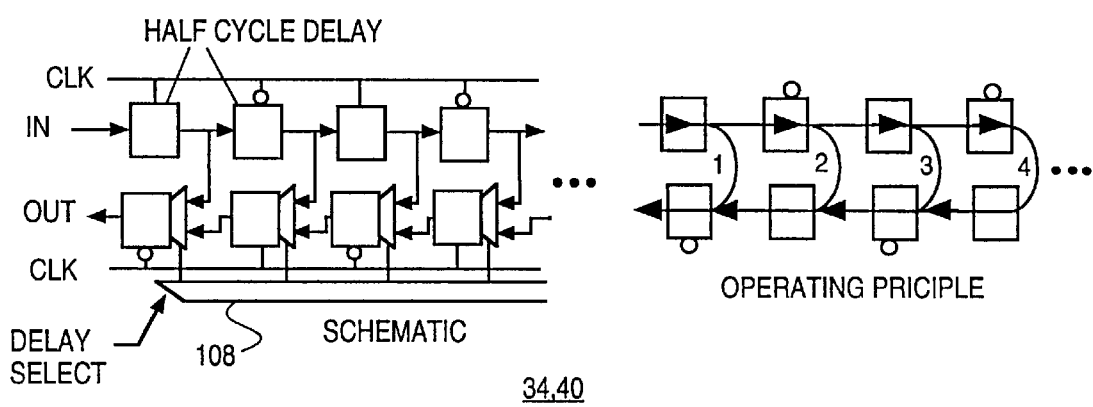
FIG. 8 depicts a digital delay of FIG. 5 under an alternate embodiment of FIG. 3, using a trombone shaped shift register with selectable turn-around points.

Given the buffering problems described in the previous two structures, a single input/output approach is preferred. One such structure is a trombone shaped (CCD or CMOS) shift register 34, 40, shown in FIG. 8, with selectable turn-around points under another illustrated embodiment. Data enter at the top and flow to the right. A decoder 108 selects one of the turn-around points taking data from the top row rather than data flowing to the left in the bottom row. Every delay stage in FIG. 8 represents half a delay cycle, thus requiring two such delays per sample. Delays are gated on opposite levels of the sample clock (or by non-overlapping two phase clocks).

III.3.4. Complementary delay line using a gray-code crossbar network.

Another novel single input, single output delay structure 34, 40 under another illustrated embodiment has been developed using binary length delay stages separated by crossbar switches 110, as shown in FIG. 9. The input is split/buffered to two "complementary" delay lines traversing mutually exclusive combinations of long and short delays. Each loop of $2^N+1$ delays provides $2^N$ more stages than the single (pass) stage at its base. Crossbars 110 at the base of each loop connect the two delay lines in passed or crossed configurations. By appropriately controlling the crossbars 110, one of the two delay lines can apply an arbitrary delay. Additionally, these crossbars 110 can be switched while data flow through them to apply dynamically changing delays.

The crossbars 110 are important functional elements within the complementary delay line. A CCD implementation of the crossbar embodiment requires the structure 110 shown in FIG. 10. By changing the clock driving patterns on the right side of the structure (illustrated by switches), the crossbar 110 can be switched from pass to crossed operation, or visa-versa. A CMOS implementation requires four pass-gates selecting a path for each delay line.

The justification for having two delay lines is that one acts as a reservoir for inserting or extracting samples from the other. More accurately, the "complementary" delay line contains a sample series offset by one sample compared to the output delay line at a specific crossbar. When this crossbar switches, it extends the sample series by switching in the input segment of the complementary delay line (one sample longer). This complicated switching method will be explained further shortly.

The order and time at which crossbars switch is very important. The crossbars actually follow a mirrored gray-code counting method as the delay length is incremented or decremented, assuming a '0' represents pass and a '1' represents cross. The gray-code is a Boolean encoding of M bits uniquely representing $2^M$ different states, where each differs from the previous by switching only one bit from a '0' to a '1' or '1' to '0'. As an example, a four bit gray code is shown below.

| Gray code | Mirrored | Decimal | Delay |
|---|---|---|---|
| 0000 | 0000 | 0 | 4 |
| 0001 | 1000 | 1 | 5 |
| 0011 | 1100 | 2 | 6 |
| 0010 | 0100 | 3 | 7 |
| 0110 | 0110 | 4 | 8 |
| 0111 | 1110 | 5 | 9 |
| 0101 | 1010 | 6 | 10* |
| 0100 | 0010 | 7 | 11* |
| 1100 | 0011 | 8 | 12* |
| 1101 | 1011 | 9 | 13 |
| 1111 | 1111 | 10 | 14 |
| 1110 | 0111 | 11 | 15 |
| 1010 | 0101 | 12 | 16 |
| 1011 | 1101 | 13 | 17 |

-continued

| Gray code | Mirrored | Decimal | Delay |
|---|---|---|---|
| 1001 | 1001 | 14 | 18 |
| 1000 | 0001 | 15 | 19 |

Figure 11:
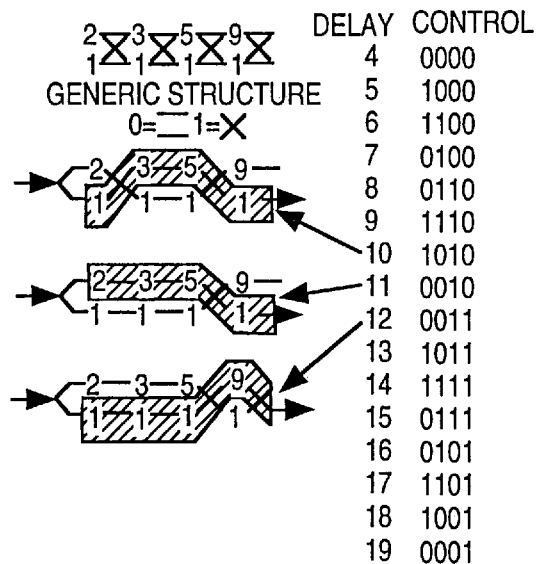
FIG. 11 depicts a digital delay of FIG. 9 illustrating control of the complementary delay line structure.

To demonstrate the gray-code control feature of this structure, FIG. 11 depicts a four stage (loop) complementary delay line with a '1010' crossbar pattern (6 decimal). The path from input to output traverses 10 stages. Changing the crossbar control code to '0010' now imposes an 11 sample delay. Likewise a '0011' code yields a 12 sample delay, etc.

Figure 12A:
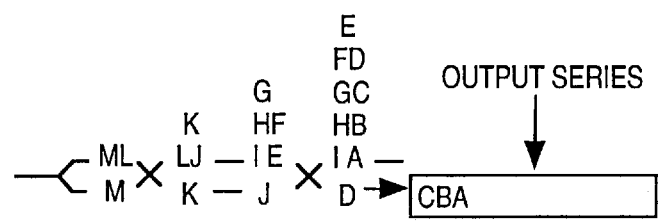
FIGS. 12A–D depicts a digital delay of FIG. 9 showing an example of a four loop complementary delay line with monotonic (alphabetic) sample series input.
Figure 12B:
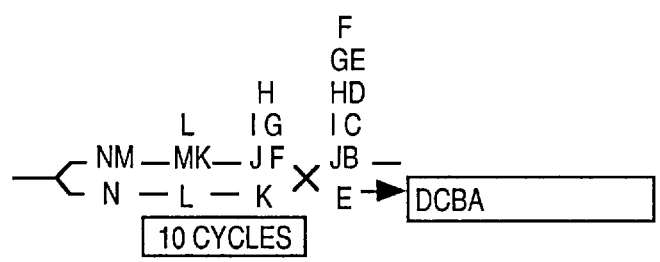
Figure 12C:
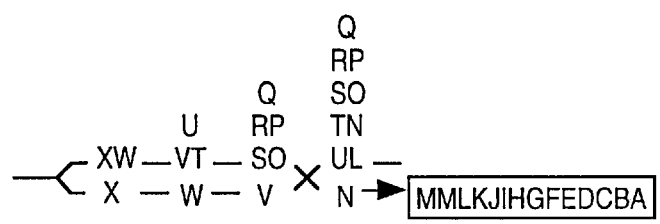
Figure 12D:
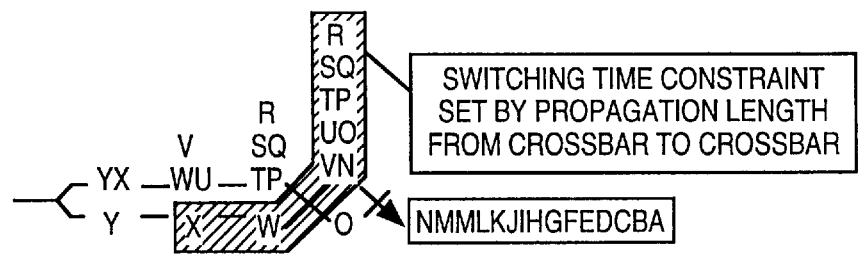

The output sample stream from this structure must be monotonic; however, this limits the rate at which the crossbars can switch. More specifically, the 'complementary' sample series takes time to propagate from a switched crossbar close to the input to another crossbar closer to the output. As a result, there are gray-code (bit) dependent timing constraints that should be observed before changing crossbar control lines. Take for example the '1010'→'0010'→'0011' transitions discussed above (shown in the table with *) and shown in FIG. 11. Placing two series of alphabetically ordered (monotonic) samples within these delay lines, we have the situation depicted in FIG. 12A. The series 'D-M' is in the currently selected output delay line, experiencing a 10 sample delay through the structure. If the samples are shifted one position and the left most crossbar switches according to the control code, then the new output sample series is 'E-MMN', with a repeated 'M' shown in FIG. 12B. The rightmost crossbar is the next to switch; however, doing so right away produces the nonmonotonic output series, 'A-EC-LN'. Instead we must wait 11 cycles for the 'N' sample at the first crossbar (that which was last switched) to propagate through the structure to the last crossbar (that which is to switch next) before we make the change, shown in FIG. 12C. After 11 cycles the last crossbar can be switched, yielding an output and in-structure sample series of 'A-MMNN-Y', as in FIG. 12D.

The control scheme for the complementary delay line is complicated by these switching constraints. The required offsets depend on the location of the crossbars within the structure and have thus been named "geographic offsets". The following table presents the geographical offsets for an 8-loop, 255 stage delay:

| Crossbar to Switch | Geographical Offset |
|---|---|
| 2 | 3 |
| 3 | 6 |
| 4 | 11 |
| 5 | 20 |
| 6 | 37 |
| 7 | 70 |
| 8 | 135 |

Figure 13:
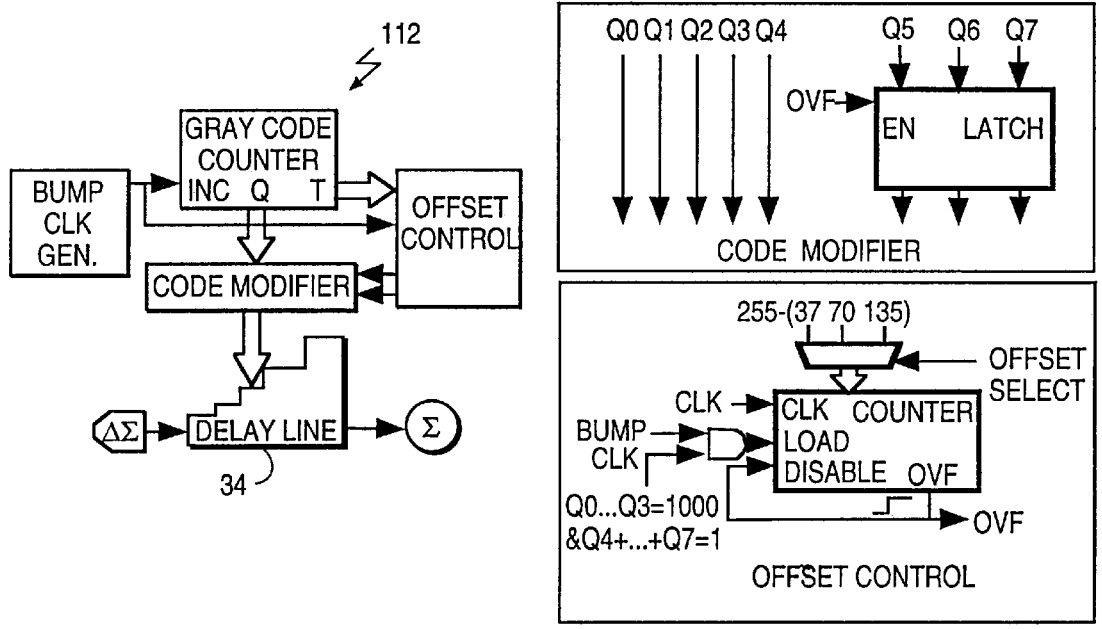
FIG. 13 depicts a digital delay of FIG. 9 showing crossbar control circuitry allowing propagation from the least significant crossbar to the more significant crossbars, thereby preserving sample series monotonicity.

For very slowly changing delays, these geographical offsets can be ignored because the samples would have plenty of time to propagate through the structure before a new delay code needs to be applied. For the receive imaging case we consider in the next section, however, delay changes can occur as fast as 1 delay change (hereafter referred to as a "bump") every 32 sample clock cycles. Ideally we could use two counters to control the structure: one gray code counter provides the control bits to the delay line, and the other counts down the geographic offsets (greater than 32) before allowing another gray code increment. Referring back to FIG. 12C, however, we notice that lesser significance crossbars (closer to the input) can be changed to reorder the sample stream near the 'W' sample BEFORE the most significant crossbar changes to reorder the stream at the 'N' sample. The resulting control codes would make the following transitions: '1010'→'0010'→'1010'→'1011'. FIG. 13 presents a control structure 112 that generates this unusual crossbar control pattern.

The gray code counter in FIG. 13 outputs eight crossbar control lines under another illustrated embodiment. The least significant five of these, Q0–Q4, are applied to the delay line directly. The other three, Q5–Q7 are conditionally held within a latch that drives the more significant crossbars of the delay structure. When lines Q0–Q3 are '0000', and one of Q4 . . . Q7 equals one ('1'), then we are in a state, call it ε, where one of the more significant crossbars will change. Prior to entering ε (Q0–Q3='1000'), the binary counter is loaded with an offset value (255—(geographic offset)). In state ε the binary counter increments at the sample clock rate, latches are disabled, and the gray code counter is decoupled from the significant crossbars. The gray code counter, however, can still increment on another "bump", changing the lesser significant crossbars. When the binary counter overflows, the geographic offset has expired and the significant portion of the gray code control sequence can be applied to the delay line (i.e. the latches are enabled).

Figure 14:
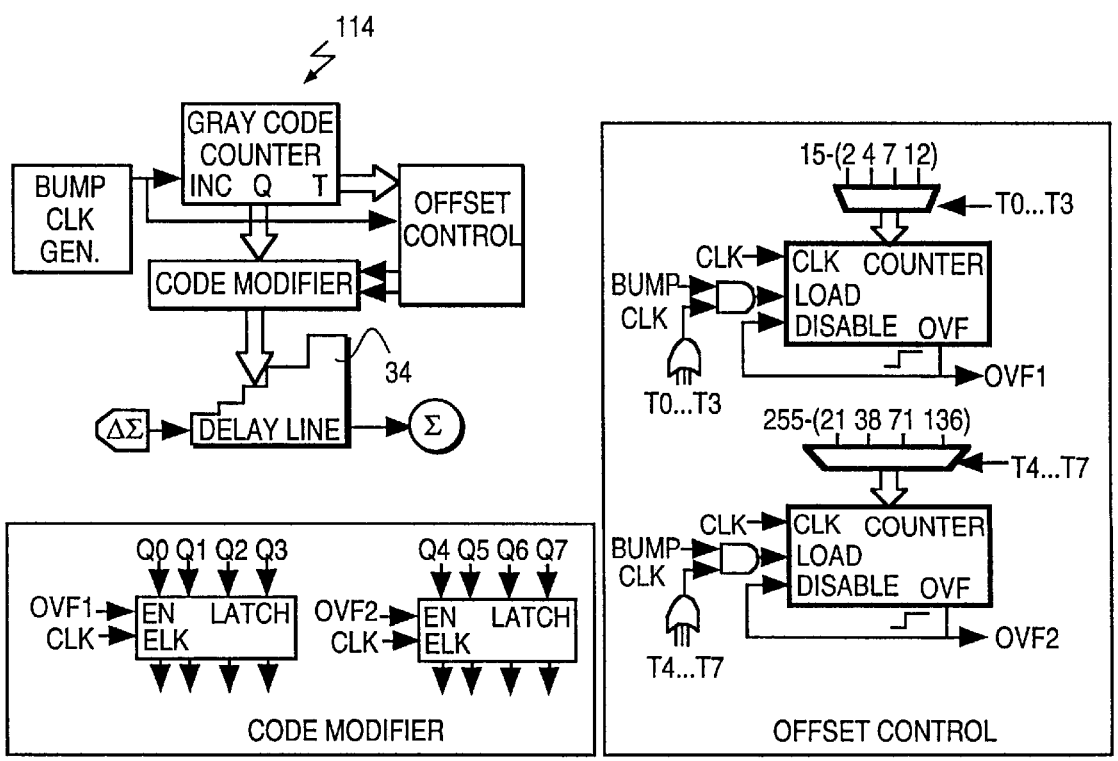
FIG. 14 depicts a digital delay of FIG. 9 showing crossbar control circuitry to explicitly control which sample within the structure is repeated or dropped.

The complementary delay line control discussions presented so far assumed that it was not important which samples are repeated or dropped, just that they form a monotonic series. If we care about repeats or drops, the illustrated structure 114 shown in FIG. 14 is appropriate. It is very similar to that discussed above, except now every geographical delay is significant because it determines the length of a sample's propagation path from the input to the crossbar repeating or dropping that sample from the output series. The same basic principle is used, however, to hold off crossbar control lines for a specific period until the samples in the structure have propagated sufficiently. The 'T' control lines generated by the gray code counter are actually the 'toggle' controls for each bit within the counter; only one of the 'T' lines will be high at any time because only one bit changes during an increment.

The complementary delay line implemented in CCD technology is, to our knowledge, a novel concept. It may be novel for CMOS implementations as well. Although efficient, other potential structures exist.

III.3.5. Segmented linear register with variable input or output

Figure 15:
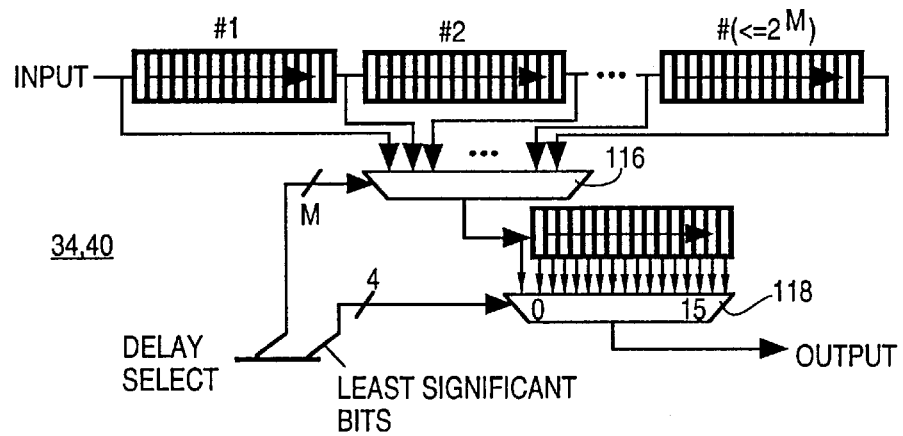
FIG. 15 depicts a digital delay of FIG. 3 under an alternate embodiment showing a hex tree segmented linear shift register with variable output and constant input.

Another possible delay line implementation 34, 40 similar to the linear shift register discussed previously (III.3.1. & III.3.2.) is a segmented linear shift register that considerably reduces the multiplexer/decoder complexity using a hex tree multiplexing method. Just as a binary tree iteratively splits a signal into two branches, a hex tree iteratively splits a signal into 16 different branches. Applying this to the problem of multiplexing 256 delay stages into a single output results in the structure shown in FIG. 15. The first, coarse level of multiplexing uses a 16:1 multiplexer 116 tapping the 240 (=256–16) delay line in 16 different places. A second, fine level of multiplexing 118 takes this signal and inputs it to another 16 stage shift register and selects one of those outputs as the final result. The control lines for the coarse and fine multiplexers 116, 118 represent the upper and lower four bits, respectively, of the delay selection counter. This configuration represents a variable output structure with a single input; however, a simple reorganization of the elements can produce a variable input structure with a single output. For reasons that will become apparent later, we will be primarily interested in the variable output structure, also referred to as an output referred structure.

III.3.6 barrel shift delay technique

In addition to the many digital delay techniques presented above there is another technique that reduces the number of total storage (bit-delay) nodes necessary for a digital delay structure 34, 40. This structure uses a 1:16 parallel to serial structure at the input to the dynamic delays, plus a bump flag data bit indicating whether a premod phase bump has occurred somewhere inside the group of 16 samples, called a frame. If that bump flag is set then one data bit in the frame is bumped, by inserting a zero sample after (or before) it. The point at which the zero sample is inserted in the frame varies depending on the current sub-frame delay of the structure (to the accuracy of one sample). To understand this we must first show how the structure operates.

Figure 34:
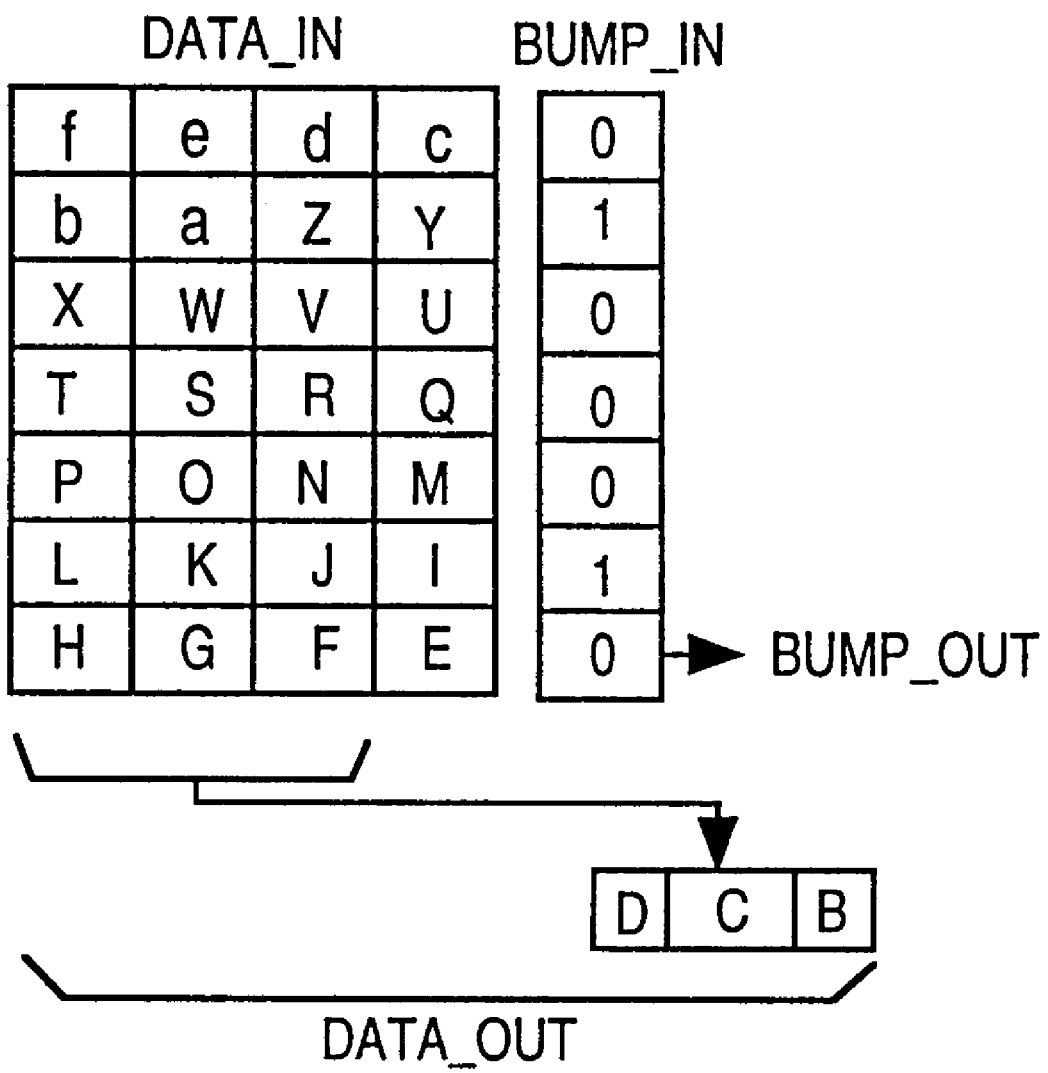
FIG. 34 depicts a delay structure of FIG. 3 showing a coarse delay structure composed of a shift register or FIFO.

FIG. 34 depicts a 5 bit×7 frame shift register (flowing downward) or equivalently a 7 entry FIFO that forms the primary storage component of the delay line under another illustrated embodiment. The bump_in bit comes directly from the bump clock generator 30 that increments the phase of the premodulation signal at the input to the delta sigma modulator 24. The data_in is loaded from a serial to parallel converter 28 so the data fills the structure in a raster form as seen in FIG. 34 with the data in alphabetic order.

The bump_out signal indicates whether a phase bump took place within the data frame that is currently at the output of the FIFO (samples E-H in the example above). All of the samples except the first in the output frame are stored for one delay line shift in a temporary register (samples B-D in the example above). A subset of the data_out samples will be used to provide the single sample delay accuracy required by the beamformer specification. To achieve this delay accuracy we use a 4 bit(output) barrel shifter that acts on data_out to shift the data by up to three samples (for this 4 bit frame case). From the example above, therefore, there are four possible data output frames: E-H, D-G, C-F, & B-E. The single sample delay capability of this structure should be somewhat apparent because of the single sample difference between the different data output frames. Another example is necessary to further illustrate the operation of the structure.

Figure 35A:
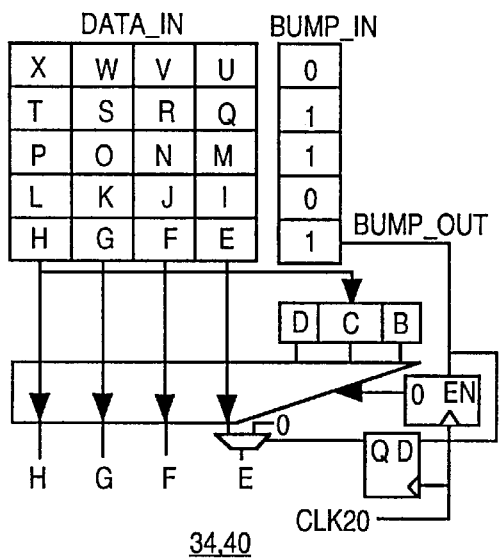
FIGS. 35A–C depicts a dynamic delay structure of FIG. 3 showing three cycles of operation.

We start off by not shifting the output data, so the current FIFO outputs are passed to the output of the barrel shifter, as shown in FIG. 35A.

Figure 35B:
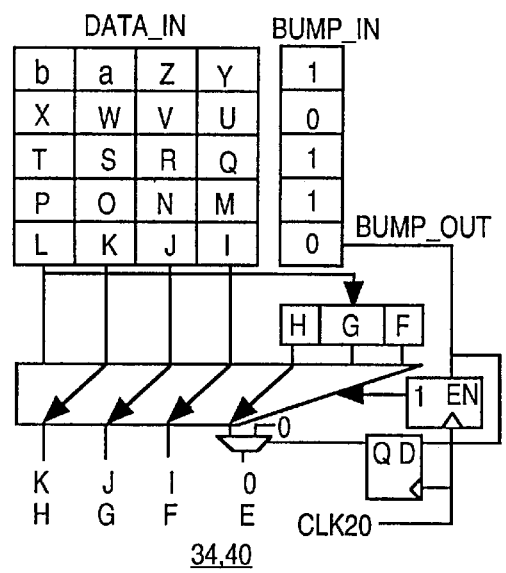
Figure 35C:
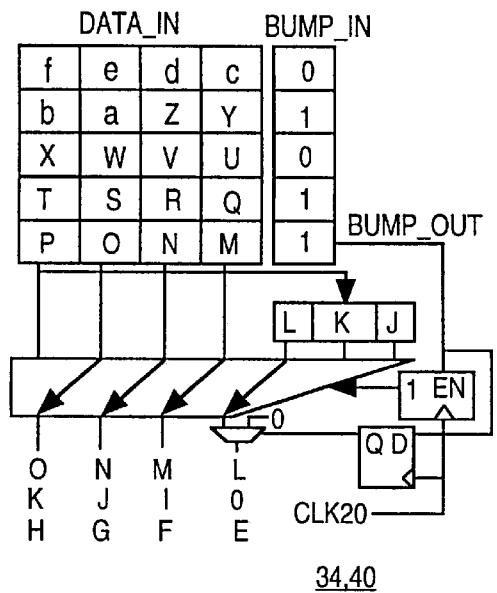
Figure 36A:
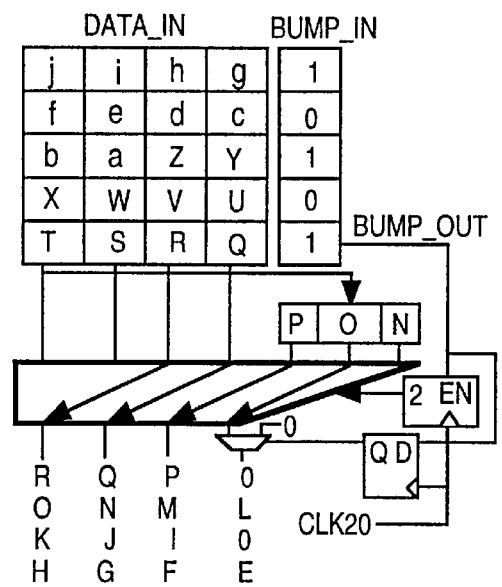
FIGS. 36A–C depicts a continuation of the examples of FIG. 35.
Figure 36B:
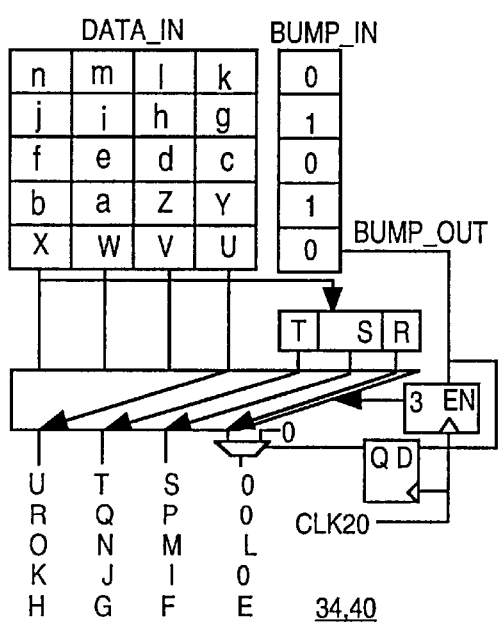

The bump_out flag for the current HEFO output in FIG. 35A enables an increase in the delay on the following cycle. After four sample clocks, the delay structure is clocked again, and the next FIFO memory location is read out. The barrel shifter increases its shift by one bit and the multiplexer at the output switches in a zero (0) sample (also referred to as the fill bit), as shown in FIG. 35B. The bump_out output of FIG. 35B indicates that the frame is unbumped so on the next cycle, (FIG. 35C), the shifter maintains its shift, however, now the output multiplexer allows the shifted datum (sample 'L') through. The output sample series at the bottom of these figures shows that the correct sample series is produced. FIG. 36 continues this example until the barrel shifter applies its maximum shift.

Figure 36C:
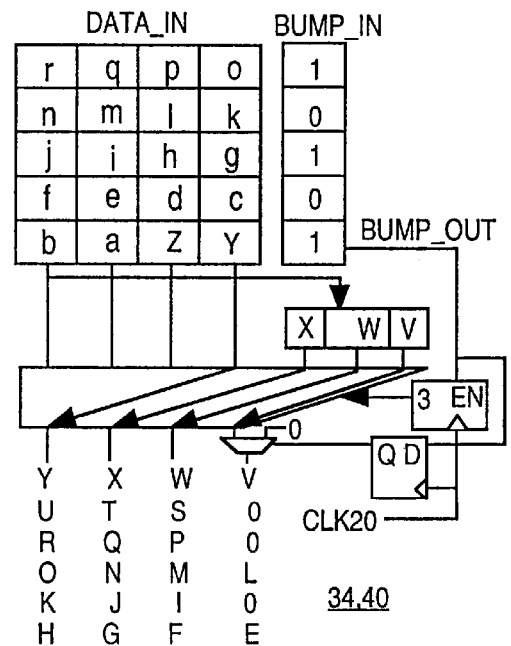
Figure 38A:
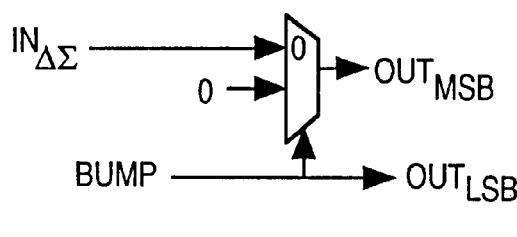
FIGS. 38A–D depicts fill-bit circuits for the bumped sample datapath of FIG. 3.
Figure 38B:
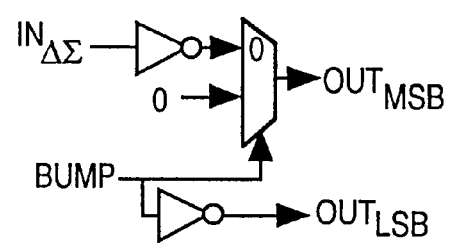
Figure 38C:
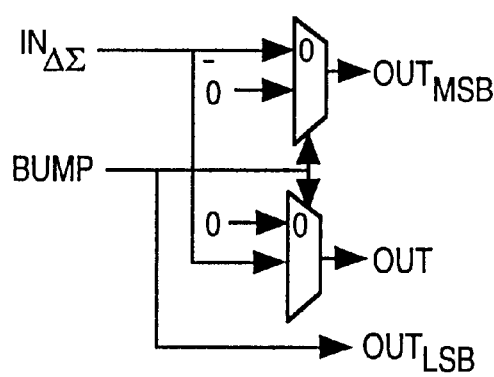
Figure 38D:
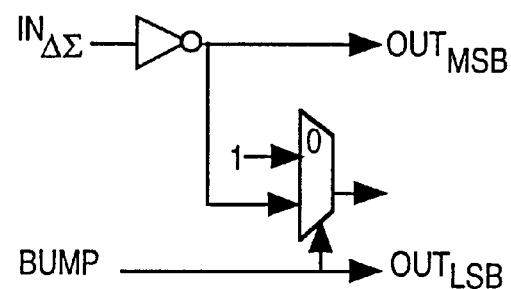

The status of the system shown in FIG. 36C is significant in that the bump coming up in the next cycle (due to bump_out=1) can be accomplished by simply returning the barrel shift control to 0 (no shift) and multiplexing in the zero sample without changing the read pointer of the FIFO (i.e. the output). This will result in the FIFO getting one frame longer due to the new data being input at the top as shown in FIG. 37.

It is important to realize in FIG. 37A that even though the bump_out output is set, the bump which that flag represents has already been applied (from FIGS. 36C to 37A). As a result circuitry must be added so that after the barrel shift cycles back to zero bit shift, the bump flag at the FHFO output must be disregarded, as indicated in the figure by an 'X' over the flag.

FIG. 37B illustrates the same situation as presented in FIG. 35A, and the entire sequence can begin again.

As we mentioned at the start of this section, the point at which the zero sample is inserted into the output series varies according to the sub-frame delay. From FIG. 35A we see that frames 'E-H', 'M-P', & 'Q-T' have set bump flags. Referring to the output series in FIG. 4B, the zero samples are seen to be inserted after the 'H', between the 'O' & 'P' and between the 'R' & 'S' for these three bumped frames. Clearly the inserted zero sample is migrating from the end of the frame to the beginning. FIG. 37A shows the final zero insertion between samples 'Y' & 'Z'. Once the barrel shifter cycles back to zero shift, then the zero insertion point moves to the end of the frame again. Therefore, the time at which the bumps are applied to the output series changes as a function of delay, however the bumps are always applied within the frame of data that is indicated by the set bump flag.

III.3.6.1 Incorporating barrel shift delays into the delta-sigma delay structure An interesting simplification can be made using the barrel shift delay technique because it realigns the bump (zero sample insertion) to a fixed position in the parallel output word (see section IV.3 where zero insertion is described in more detail). In the examples presented above the zero sample is always in the right most datapath. For the delta-sigma beamformer, we use the zero insertion to avoid introducing any power (offset) into the +1 and −1 modulated sample stream. The binary encoding of these two valid modulator outputs are:

| Sample | Level | Binary |
|--------|-------|--------|
| +1     | 1     | 1      |
| −1     | 0     | 0      |

When the delay changes and the zero sample is inserted, the binary encoding must change to:

| Sample      | Level | Binary |
|-------------|-------|--------|
| +1          | 2     | 10     |
| zero insert | 1     | 01     |
| −1          | 0     | 00     |

Naturally since the +1 and −1 levels for this bumped sample have been scaled by two, all of the other samples in the frame must be scaled by two as well. However, the other samples can pass through the rest of the beamformer without being scaled by two until they reach the output stage 48 because they are always added with other unbumped samples. This means that throughout the beamformer the 15 unbumped samples (for a 16 sample frame) will be require one bit less than the single conditionally bumped sample. For the 256 frame static delay this is a savings of 3,840 storage cells.

Figure 32:
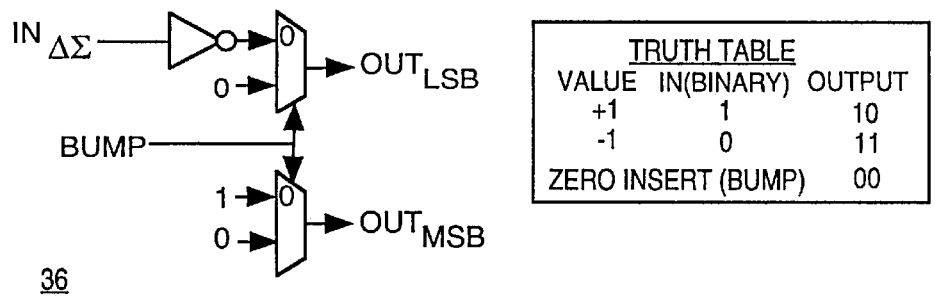
FIG. 32 depicts an implementation of a fill bit circuit of FIG. 3.

As shown in the table above, multiplexing in a zero is slightly more involved than is illustrated in FIGS. 35–37. Section IV.6 proposes (and FIG. 32 depicts) a two's complement encoding of the fill-bit. A similar structure is presented below that accomplishes the appropriate code insertion for a bumped sample:

This circuit 120 of FIG. 38 is actually simpler than the two's complement method, since it does not involve an inversion of the $\Delta\Sigma$ input.

The barrel shift delay methodology works well with the fill-bit circuit above to produce an asymmetric (15 normal, 1 bumped) parallel output from each channel. These delays can be changed dynamically as required for dynamic receive focusing in the beamformer. Although the bump is not uniformly applied within each frame of data, the sampling rate is high enough that this will not cause any distortion of the image. There was a concern that because every 16 beamformed output samples will have a number of simultaneous fill bits that this may cause a detectable glitch in the image. Simulations on real data indicate that no such glitch is detectable after the low-pass reconstruction filter is applied. Again, the range clock (set by the frame width) is sufficiently fast that only a few channels out of the 512 will bump their delays, so the effect is minimal.

III.3.A. Serial to parallel conversion

To reduce the clock rates of all potential shift register designs, a serial to parallel conversion (S:P) 28 can be made at the input, yielding a multi-channel delay structure equally delaying groups of data. Reducing the clock rate of CMOS and CCD circuits linearly reduces power consumption. Serial to parallel conversion is the process of converting a high rate, N-bit wide data stream into a m*N-bit wide data stream running at 1/m the original rate. The physical chip area of these structures is comparable to the original, just their relative dimensions would change. For example, a 1×128 element delay line can be implemented as a 4×32 structure. Depending on implementation and layout specifics, it may be beneficial to perform this conversion for reduced power consumption. It may also simplify the design of otherwise very high clock rate circuits.

In other portions of the beamformer 10 within the transmit path, see FIG. 3, parallel to serial conversion (P:S) 28, 76 reduces data bit widths at the expense of higher clock rates. An example of this can be found at the output of the multi-bit dynamic shift register delay lines described earlier. To get single sample delay accuracy, a P:S stage follows the multi-word delay line so that the appropriate sample delay can be applied at the output. That is, the delay accuracy within the delay structure is defined by how many samples wide the delay structure is. To fine tune this delay, a P:S can be performed to get single sample delay accuracy.

III.4. Delay Line Input Multiplexer

The input to each delay line includes a multiplexer selecting data from either receive or transmit paths. Generally, the time at which the multiplexers switch 14 from receive to transmit (Rx/Tx) mode is controlled by the front-end controller (see FIG. 1, for example). To accommodate differing array geometries, the transition from transmit to receive (Tx/Rx) mode is performed on a per channel basis. The control means described in section III.5 toggles each datapath element from Tx to Rx including the A/D. This ensures that there will be no "dead time" between the end of transmission and the beginning of reception.

III.5. Digital to Analog Converter (D/A)

Transmit pattern encoding may be accomplished off-line by software emulating a $2^{nd}$ or $3^{rd}$ order delta-sigma modulator with a 2 or 3 level quantizer. For a 3-level quantized system the +1, –1, 0 samples are encoded as given in section III.2 and converted into analog voltages at every channel following the digital dynamic delay. The digital to analog converter is considered to be 1.5 bits because it only uses 3 of the possible 4 binary levels for amplitude encoding. Otherwise a 2-level quantized single bit system uses a 1,0 coding for +1,–1 levels, respectively.

As mentioned in the previous sections, transitions from receive to transmit mode, and visa-versa, require special processing. The transmit D/A converter receives data delayed through fixed and dynamic delay structures 34, 40 of the beamformer 10. However, when the front-end controller (see FIG. 1) indicates that the system should transition from receive to transmit, data arriving at the D/A 78 still consists of $\Delta\Sigma$ modulator samples injected into the delay lines at the end of the prior receive cycle. As a result, a counter 74 on every channel tracks the leading edge of the transmit data as it progresses through the delay lines, and sends a 'start' signal to the D/A 78 when valid transmit data has emerged from the delay lines and should be converted. In fact, there are two counters, one for every channel in azimuth, counting the delay through the fixed delay. The 'start' signal from this counter is propagated to a second counter on each elevational channel tracking the transmit data through the dynamic delay. The 'start' signal from this second counter initiates D/A conversion of the transmit pattern.

The transition from transmit to receive mode could be considerably easier if the system used a 2 bit transmit encoding or a slow (160 MHz) sampling rate. A system using a 2-bit transmit pattern encoding would have the last sample read from the transmit memory assigned the '10' reserved code followed by constant '00' samples. These '00' samples are multiplexed into the sample stream at the memory's output. The '10' code signals the end of the transmit waveform. As it progresses through the transmit beamformer, it changes the state of some functional elements from transmit to receive. The multiplexers at the input to the delay lines, for example, change from the transmitter input to the receiver input when the '10' code emerges from the delay line. The 1.5-bit DAC 78 and front-end driver circuitry shut down to conserve power when the '10' code arrives.

Single bit transmit pattern encoding has no "extra" codes available for signaling the transmit (Tx)-receive (Rx) mode transition. However, if the Tx sample rate is chosen to be half the receive sample rate, the datapath through the delays has at least twice the bit width of the transmit words. This means that a flag bit can be inserted into one of these extra bits and propagated through all the delay lines. As it reaches certain functional elements (delay lines or the DAC) it changes their operation from transmit to receive. The flag bit can be a '1' during the transmit pattern and a '0' at the end of it.

For a single bit transmit encoding at 320 MHz, the entire dynamic delay line bandwidth is used to carry transmit data. As a result, a set of counters 32 is necessary to track the end of the transmit data as it progresses through the delay line. When the last piece of data for a particular transmit channel has emerged from the delay line, the D/A 78 is disabled. A similar mechanism required at the beginning of the transmit cycle, i.e. the Rx-Tx transition, has already been described.

The implementation of the D/A for every channel is discussed in the following section.

III.6. Transmit Analog Low-pass Filter

The transmit low-pass filter 80 following the D/A 78 reduces high frequency power present in the delta-sigma modulated transmit pulse. To some extent the D/A 78 can be designed to filter high frequency components by limiting the slew rate of the analog drivers. The low-pass filter may be an analog FIR implementation of a multiple zero comb filter with up to 31 nulls equally spaced from DC (0) frequency to the sampling rate ($2\pi$). These nulls will reduce the delta-sigma noise power lying above 11 MHz, which lies outside the passband of the transducer.

Figure 16:
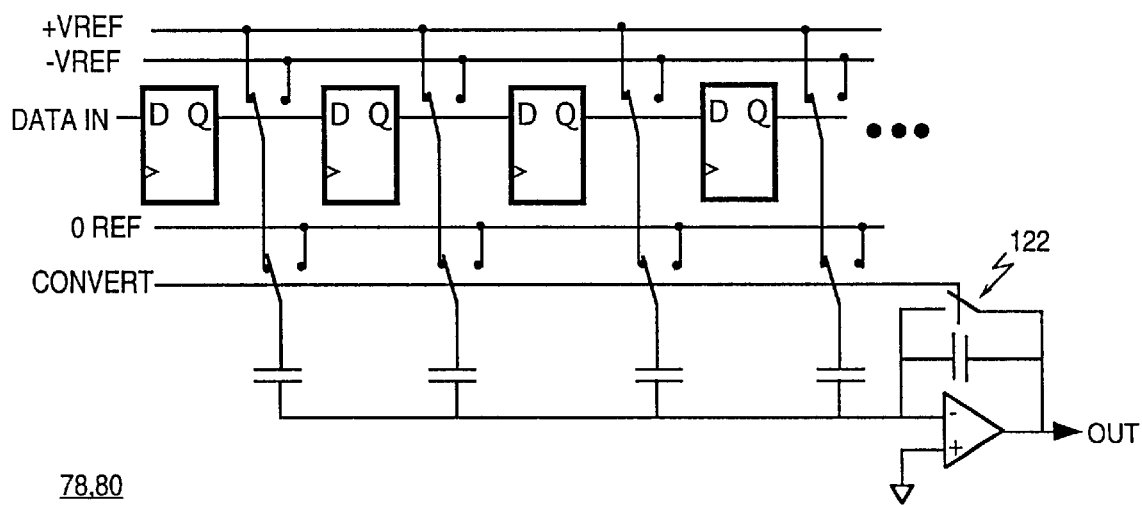
FIG. 16 depicts a combined comb filter and D/A structure of FIG. 3 which converts a ΔΣ modulated digital data stream into a filtered analog voltage used to drive each transducer element.

A very simple filter structure (FIG. 16) may be used to implement both the D/A function as well as the comb filter. FIG. 16 shows a 2-level implementation of a switched capacitor summing junction (the common node) buffered to drive the transducer element. Each capacitor is (nominally though not necessarily) the same size and contributes to the summing node a quantity of charge proportional to the +Vref or −Vref voltages supplied to the circuit. A +Vref voltage is applied to a capacitor if that bit of the input sample series is a '1'. Otherwise −Vref is applied if the input bit is a '0'. Three level transmit encoding can be converted in a similar way using +Vref, 0, and −Vref analog voltages.

The number of summing capacitors (and the length of the shift register that controls the switches) determines the number of nulls in the frequency response of the filter. Sixteen capacitors yields 15 nulls, the first of which is at $\frac{1}{15}^{th}$ the sampling frequency. If a 320 MHz transmit sampling rate is chosen, the first null of the filter will be at 21 MHz. The choice of how many nulls (summing capacitors) to implement will be made according to the noise power reduction requirements of the system. More complicated filters can be synthesized by varying the size of each of the capacitors, which is another performance related design issue.

The clamp transistor 122 on the feedback of the analog buffer sets the DC value of the D/A-filter structure. Prior to and after generating an analog output, the capacitor switches will connect to a DC zero halfway between the reference voltages. When the clamp transistor is released, the summing node and buffer can be driven by incoming data. The "convert" line shown in FIG. 16 controls this DC calibration.

Figure 17:
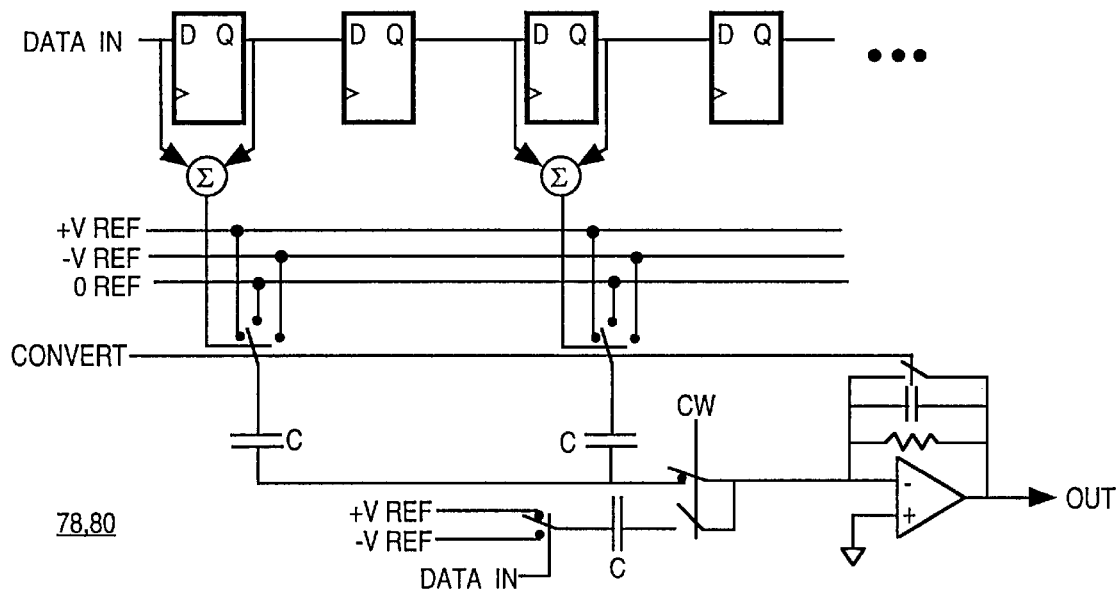
FIG. 17 depicts a modified filter and D/A structure of FIG. 3 that uses the zero reference voltage as a possible level out of the D/A rather than just as a reset voltage.

Since the D/A requires three reference voltages anyway, two data samples can be added together yielding a digital +2, 0, or −2 value which can be directly converted to analog form using the structure shown in FIG. 17. This structure has ½ the number of capacitors as the previous one. For CW operation, the transmitted pattern does not need to be filtered because a periodic square wave will be encoded. A direct connection from the +Vref and −Vref supplies to the buffer input node is provided for this mode.

III.7. Transmit apodization

Sidelobes of the transmit beam adversely affect image quality by depositing acoustic power across a wide field of view. To reduce these sidelobes, transmit aperture apodization is performed where each channel's amplitude is weighted according to its geographic position within the active array. Eight levels of attenuation (3 bits) are provided in the apodization stage 82. This attenuation is constant throughout the transmit cycle, but may be changed from firing to firing depending on the element's position within the array. (Remember the active array is sequentially stepped azimuthally across a larger physical array.)

An element is apodized simply by controlling the +Vref and −Vref analog voltages supplied to the D/A shown in FIGS. 16 & 17. Reducing the magnitude of the reference voltages reduces the analog voltage swing on the filter summing node yielding a smaller output driver voltage. A simple 3-bit digitally controlled R-2R ladder (or other active analog circuit) can be used to set these reference voltages.

III.8. Power Amplifier

A higher voltage power amplifier 84 at the output of the transmit beamformer 10 provides adequate drive current and voltage to the piezoelectric transducer 12. This amplifier should be relatively linear in phase performance and must saturate or clip cleanly. A Class AB amplifier implemented in high voltage CMOS may comprise the output stage of the amplifier.

III.9. T/R Switch

The T/R switch 86 protects receive electronics from high voltages driving transducer elements. In our case, this switch may not be necessary if the input to the low-noise amplifier (LNA) can tolerate the drive voltages produced by the power amplifier (PA).

III.10. Azimuthal Analog Multiplexer

Linear and curvilinear probes may be designed to have an active subaperture of elements stepped sequentially across a larger array. (See, for example, Maslak U.S. Pat. No. 4,699, 009.) To do this, a multiplexer 14 at the channel input must select which transducer element will be used. For the curvilinear array of 8×192 elements proposed for this system, a subaperture of 8×64 elements will be active, meaning that every beamforming channel could have as its input three different array elements. For example an azimuth beamforming channel could be connected to element #1, #65, or #129. During normal imaging situations, the end of a receive beam signals a shift of the active array by one element in azimuth. The angle of the new beam will be the same as the previous one. Since the array subaperture has physically moved by one element, however, the new beam will interrogate new tissue. For linear arrays, this technique images a rectangle of tissue. In contrast, a curvilinear array sweeps out an offset sector. The proposed array 12 has 8 elements in elevation multiplexed simultaneously because the subaperture is meant to step in azimuth only; however, there is no implicit restriction within the beamformer 10 limiting it to this specific operating mode. The beamformer 13 can support arbitrarily shaped and stepped apertures in azimuth or elevation depending on how the three multiplexer inputs are configured. Larger or more complex arrays may require more analog multiplexer inputs.

The azimuthal analog multiplexer 14 must withstand the high voltage of the transmit drivers and have low 'on resistance'. Additionally it should provide at least 60 dB of electrical isolation between transducer element inputs (i.e. crosstalk). This structure, like the T/R switch, uses high voltage CMOS passgates.

III.11 Differential Drive

To reduce the system's susceptibility to common mode noise, transducer elements drive and connect to receive circuits differentially. That is, both sides of the transducer are driven with oppositely polarized signals connected to the circuitry through two independent wires (on a flex circuit). This has two advantages. First, common mode noise on each of the connecting wires from interfering RF sources is substantially reduced. Second, the drive voltage is reduced because each side of the transducer can be driven independently in opposite directions, resulting in twice the effective AC voltage applied to the transducer.

IV. The Receive Components of the Invention

This section discusses receive datapath components as well as their control circuits. Those components common to transmit and receive have already been described in the previous section and will not be covered here. Section IV.3 discusses the delta-sigma modulator 24. Sections IV.4 and IV.5 discuss the premodulator 22 and receive apodization stages 26 preceding the delta-sigma modulator 24. They are presented after the delta-sigma because much of their operation depends heavily on the characteristics and specifics of the modulator 24.

IV.1. Low-Noise Amplifier (LNA)

Figure 18:
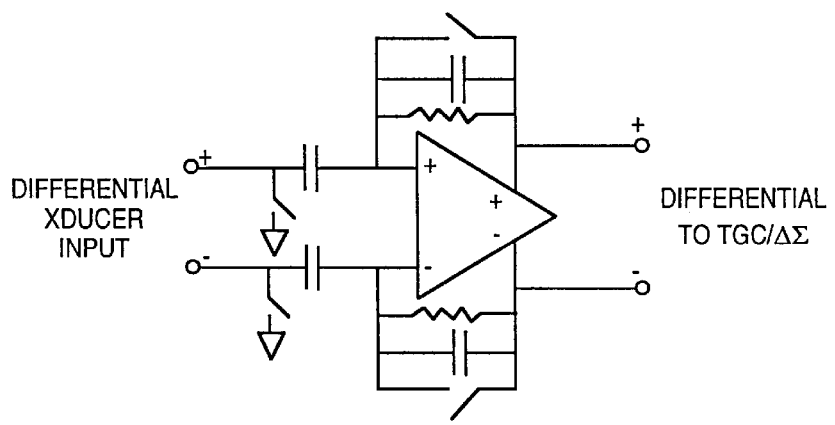
FIG. 18 depicts a low noise amplifier (LNA) of FIG. 3 providing a low noise figure and moderate gain at the system input.

The low-noise amplifier 16 is the first stage of the receive beamformer 10, taking its input from the transducer element selected by the analog mux 14. It is a high input impedance stage with only moderate gain (8–13 dB). It has a very low noise figure (defined as the ratio of noise amplification over signal amplification) to maintain an overall low noise figure for the system. This is accomplished using a capacitively coupled differential opamp with DC clamping transistors on the inputs and feedback paths, as shown in FIG. 18. The clamps are enabled during transmit, when the receive path is inactive.

IV.2. Time Gain Compensation (TGC) or Fixed Gain Amplifier

A time gain compensation amplifier 18 is used in the ultrasound imaging system to provide depth dependent gain compensating for signal attenuation within tissue. A secondary effect is to improve system noise performance. The analog to digital converter on every channel dominates system noise if the gain is fixed, since a small gain is required to avoid near field saturation. At low gain, small signals from distant reflectors are below the quantization level of the A/D. The TGC 18 compensates for this by increasing the size of the signal so that it more effectively uses the dynamic range of the A/D. The TGC 18 is applied to the signal so that Johnson noise at the input will be the dominant noise source in the digitized signal rather than A/D quantization error.

Because of the large oversampling ratios (>=160 MHz Rx sampling rate) used in this beamformer 10, the TGC 18 may not be needed for some imaging modes. For those modalities using rather low bandwidth signals, it can be shown that a fixed gain stage (between 3–14 dB) is desired. For even higher receive sampling rates (e.g. 640 MHz) the TGC and fixed gain stage can be eliminated completely. In terms of power consumption and size, these are important tradeoffs because higher sampling rates increase power consumption in the delay stages, but power consuming analog amplifiers aren't needed. Implementation specifics and analyses of these tradeoffs will determine whether the final product includes TGC, a fixed gain stage, or both. A schematic of a candidate differential TGC 18 amplifier is presented in FIG. 19.

The C2C ladder in the feedforward path 124 sets a variable attenuation factor, whereas the C2C in the feedback path 126 sets a fixed gain. The product of the applied attenuation and fixed gain specifies the overall gain of the TGC. Ideally every channel would have a separate TGC control register (counter) that would increment when a signal is received from the front-end controller. All the TGCs in the system increase their gain at the same time in response to this controller signal. The initial gain of each TGC, however, could be individually programmed by initializing the control register with a different value. This could be used to perform gain trimming or receive apodization. Gain trimming in this manner could compensate for normal processing variations within the transducer or LNA. Changing the C2C ladder on the feedback path is a second method of trimming the gain; however, this structure also sets the stability and bandwidth of the TGC so a limited range of gains can be trimmed here.

Figure 19:
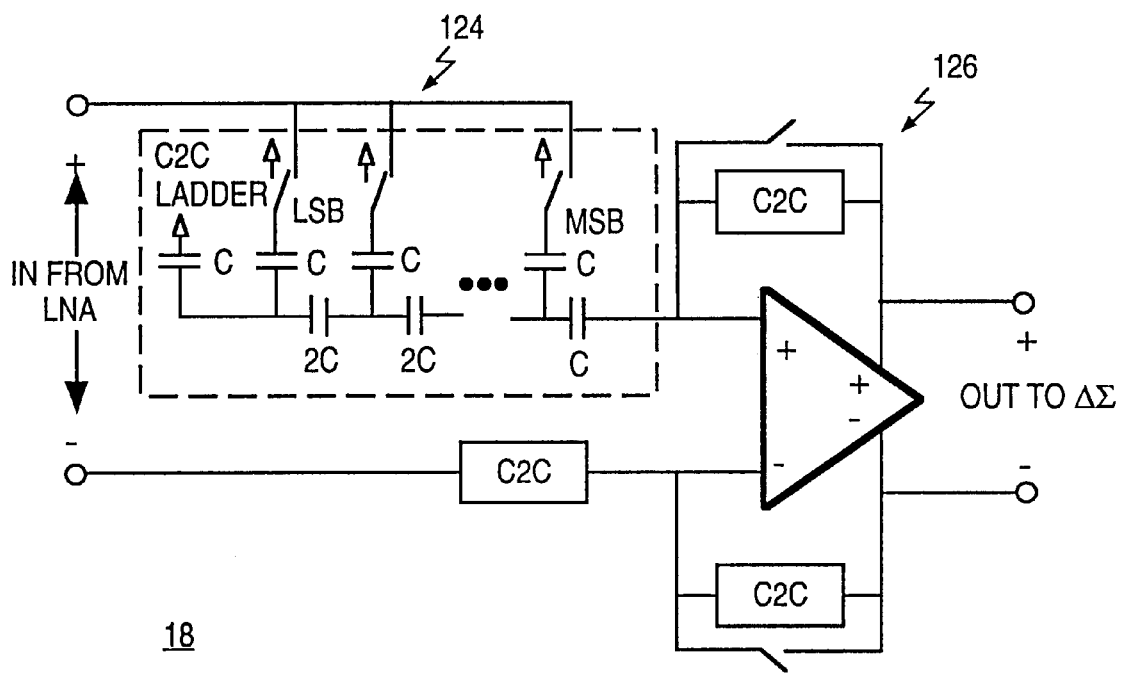
FIG. 19 depicts a schematic of the differential TGC stage of FIG. 3.

The increase in gain of the TGC 18 amplifier shown in FIG. 19 is linear as the control word increases. However, the attenuation within the body is logarithmic as a function of range, so it would be convenient to have uniform logarithmic steps in gain. This way, different channels could be preset with a particular gain and the 'increment' signal from the front-end controller would increment the gain on all channels by roughly the same amount. Using a linear sequence, those channels with larger initial gains would increase their gain by a relatively small amount compared to those channels with smaller initial gains.

IV.2.1 Exponential Decoding

A C2C ladder with a j-bit control word applies a linear attenuation to the input signal according to:

$$\text{out} = \text{in} * N/2^j, \tag{4}$$

where N is the value of the j-bit control word. If N is small, the output is small; if N is full scale ($2^j-1$), then there is very little attenuation. On a logarithmic scale this is:

$$\text{out}_{dB} = \text{in}_{dB} + 20*(\log(N) - j*\log(2)), \tag{5}$$

which is not linear as a function of N. If, however, N is incremented in powers of 2, so that $$N = 2^M, \tag{6}$$

where M is another digital integer (M=0, 1, 2, . . . ). Then the logarithmic version of the output is:

$$\text{out}_{dB} = \text{in}_{dB} + 20*(M*\log(2) - j*\log(2)), \tag{7}$$

which is now linear as a function of M, where log(2) and j are both constants. Every increment in M results in a $20*\log(2) = 6.02$ dB increase in the gain. This sort of step is too coarse for our application, so it is split into 8 or 16 linear steps. A step of approximately $(20/8)*\log(2) = 0.7526$ dB is more appropriate. Assuming 40 dB of total dynamic range is needed in the TGC, then $40/0.7526 = 53$ different steps are required. This means a 6-bit digital word is sufficient to represent all steps with a unique control code.

The 6-bit digital code is split into 2 pieces, one 3-bit word (8 codes) for a linear mantissa component and one 3-bit word (7 used codes) for an exponential component. The linear component splits the 6 dB interval into approximately equivalent steps, and the exponential portion increases the gain in an exponential fashion. More specifically, we set the linear component to:

$$N_{linN} = \text{mod}(N, 8) + 8, \tag{8}$$

where the mod( ) function is a modulo arithmetic operation limiting the result to [0,1, . . . 7]. The value of $N_{linN}$ is just the 3-bit linear control code with a $4^{th}$ set bit (8 binary) prefixed to it, so the total is a digital value in [8,9, . . . 15]. The exponential component is based on the upper 3-bits of the 6-bit control code, so that:

$$N_{expN} = 2^{(N - \text{mod}(N, 8))/8}. \tag{9}$$

This means that for N in [0–7], $N_{expN}$ will be 1, for N in [8–15], $N_{expN}$ will be 2, for N in [16–23], $N_{expN}$ will be 4, and so on. $N_{expN}$ increments in powers of 2, just as N did in (6).

Figure 20A:
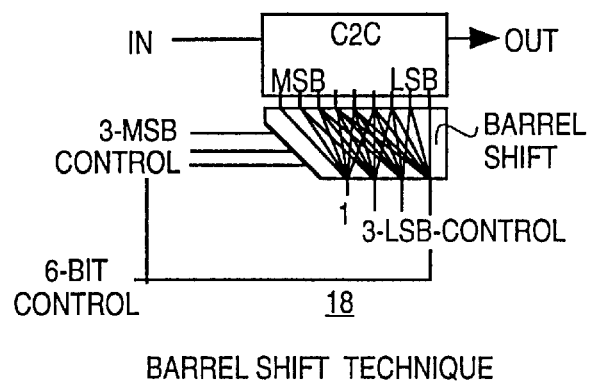
FIGS. 20A–B depicts the TGC of FIG. 3 showing two methods of multiplying the linear and exponential gains used for the digitally controlled TGC.
Figure 20B:
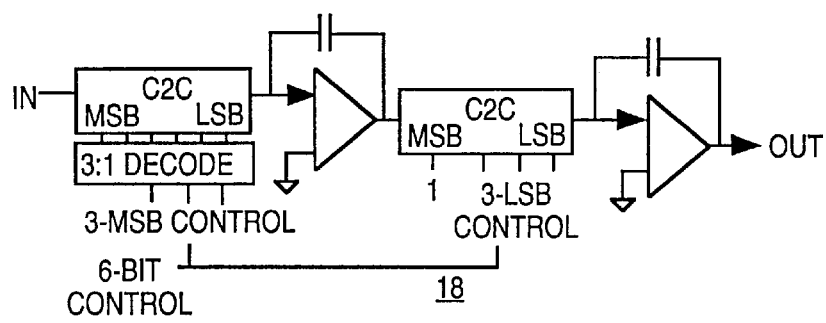

To apply an approximately exponential gain, the most significant bits are 3:1 decoded into 6 control bits to the C2C ladder, thus implementing the (1, 2, 4, 8, 16, & 32)/64 gains (attenuation), $N_{expN}/2^6$. A second variable gain stage is driven with the output of the first gain stage, as shown in FIG. 20B. The second stage applies a linear gain (attenuation) according to (8). The normalization of this gain term is $\frac{1}{2}^4$, so the total gain is $N_{linN}/2^4$. The result of the two stage variable gain structure is a product of the two individual gains, written in dB as:

$$G_{dBN}=20*\log(N_{linN}*N_{expN}/1024). \tag{10}$$

The constant 1024 is a gain offset that may be ignored in further discussions because it can be compensated for elsewhere in the system (e.g. the fixed C2C stage on the TGC feedback path). A more efficient, though less intuitive method to implement the same gain is to shift the linear gain term, $N_{linN}$, through a barrel shifting means by the appropriate number of bits to the left to realize the $N_{expN}$ gain term. The resulting value, padded with zeros ahead and behind, is used to select the gain (attenuation) of a single C2C stage as shown in FIG. 20A. Due to its simplicity, this is the preferred method of implementing the exponential gain.

Figure 21:
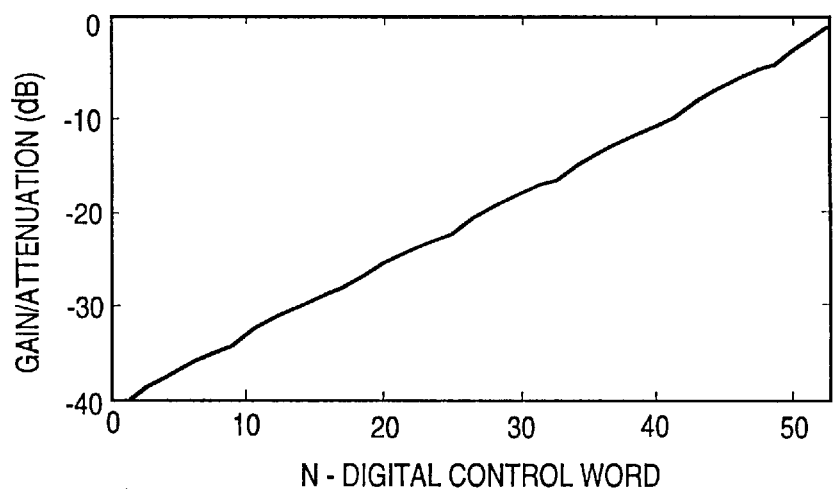
FIG. 21 depicts a plot of the applied gain versus the digital control word used for the exponential TGC of FIG. 3
Figure 22:
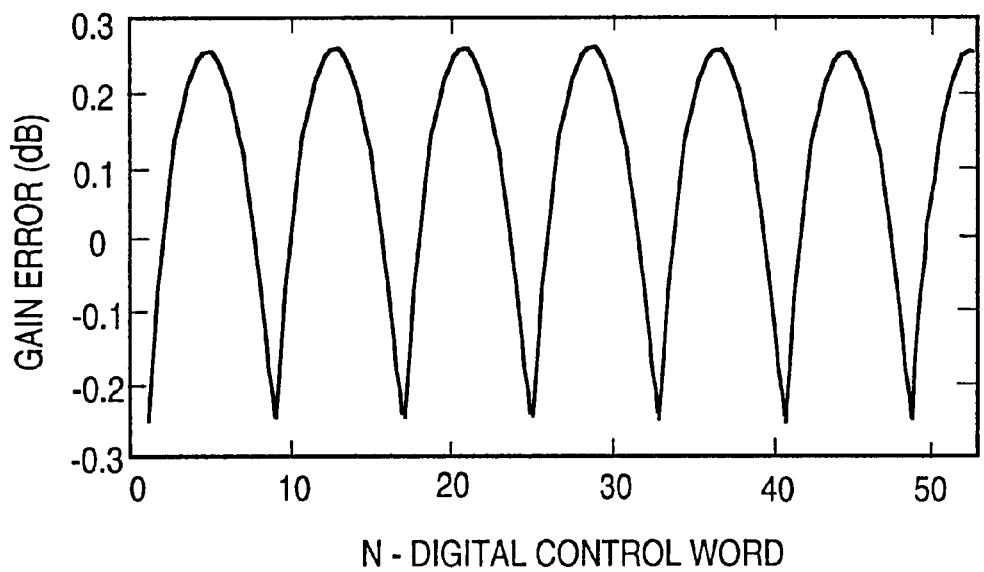
FIG. 22 depicts a plot of the error in the applied gain versus the control word values for the TGC of FIG. 3.

A semilog plot of the gain given in (10) is shown in FIG. 21. Clearly the gain is approximately linear in dB according to a linear increase in the control word, N. There is a perceptible wiggle to this line, where the 6 dB exponential steps ($N_{expN}$) intermingle uniformly among the linear steps ($N_{linN}$). A plot of the gain error is shown in FIG. 22 relative to an ideal exponential gain. The +−0.25 dB gain variance over the course of the 8 linear steps may be acceptable for most applications, given that the step size itself is 0.75 dB. These plots show that the exponential decoding of the digital control word does in fact yield an exponential gain through the TGC structure with only small error.

To decrease the linear step size of the system from 0.75 dB to 0.326 dB the decoding method can be recalculated so that the 3 most significant bits are allocated to the exponential term (still 40 dB dynamic range for example) and the 4 least significant bits allocated to the linear term. The new gain terms would be:

$$NlinN=\mathrm{mod}(N, 16)+16 \tag{11}$$

$$NexpN=2^{(N-\mathrm{mod}(N,16))/16}. \tag{12}$$

The same sort of structure as in FIG. 20A is used again, and a similar gain plot is obtained, except that there are twice as many linear steps as before. The total error variance, interestingly, is not changed by this. This is because the exponential gain term is set by the most significant bits and is limited with the C2C structure to 6 dB increments. The linear steps within these exponential steps will always differ from the ideal exponential gain by the same amount no matter how finely sampled they are (it just fills in the spaces between the samples in FIG. 22). A capacitor ladder other than a C2C structure may improve this error by reducing the exponential steps.

Figure 23:
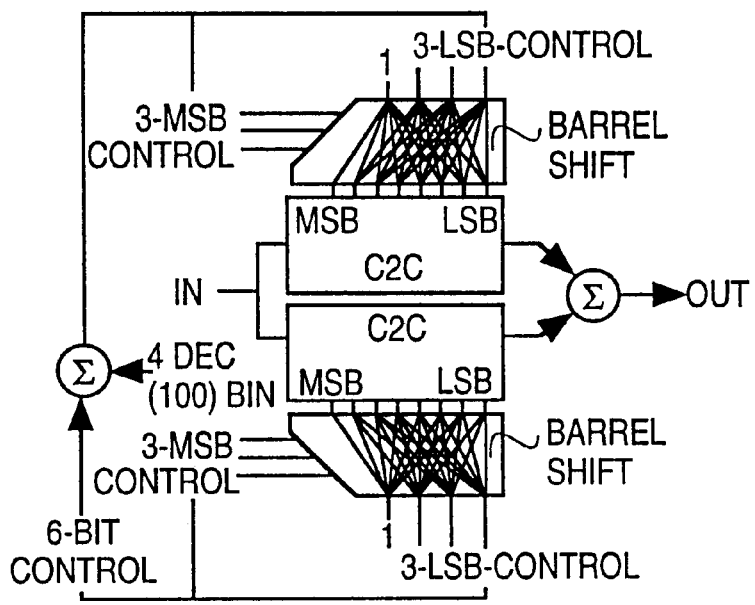
FIG. 23 depicts the TGC of FIG. 3 and a method of improving the step error (applied versus an ideal exponential) by using two C2Cs in parallel to generate two roughly equivalent gain ramps, except one ramp is offset by one half the modulus (8/2=4 in this case) so the average error is smaller.
Figure 24:
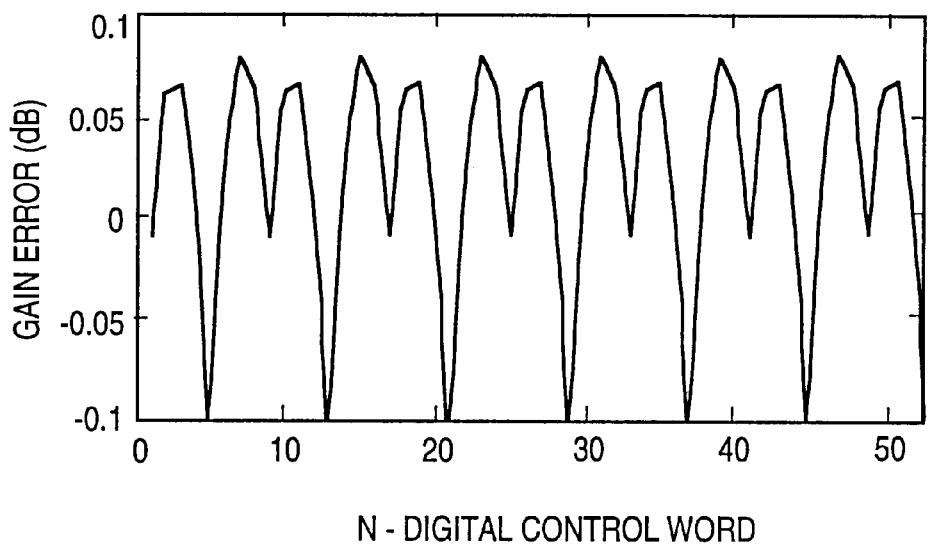
FIG. 24 depicts a plot of the error of the TGC of FIG. 3 using the applied gain versus the digital control word values and the offset ramp averaging technique.
Figure 25:
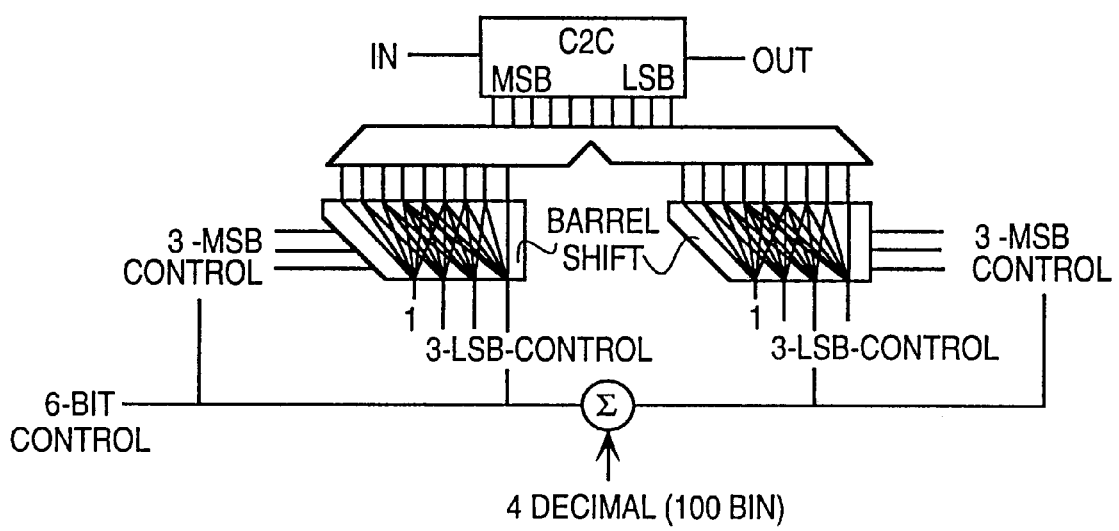
FIG. 25 depicts the TGC of FIG. 3 using a purely digital implementation of the error reducing method shown in FIG. 24.

There is a way to reduce the total error variance of the TGC by averaging two exponential gain ramps with different offset gains. Notice the 'humped' nature of the error from the single exponential ramp discussed above. If another ramp could be formed with humps overlaying the valleys of the first ramp, then their average would dramatically reduce the error with respect to an ideal exponential gain. The structure in FIG. 23 does this by offsetting the control word to the second exponential gain structure by one half the modulus (4 in this case). (The gain in this second structure is, therefore, 4*.75 dB=3 dB different than in the first structure, however this is a minimal offset that can be ignored or compensated for in programming the structure.) An analog sum is performed at the output of the C2C ladder, (or the ladders are merged into one structure). The resulting error is plotted in FIG. 24. The variance has been reduced from +−0.25 dB to +−0.09 dB, a significant improvement. Another possible implementation performs an addition of the gain products prior to applying them to a single C2C structure. This is shown in FIG. 25.

IV.3. Delta Sigma Modulator

Analog to digital converters transform an analog signal into a multi-bit digital word. Each number represents a unique analog voltage with some quantization error. A $\Delta\Sigma$ analog to digital converter, however, trades the number of bits in its output quantizer for an increase in sample rate. The single bit quantizer is significantly easier to implement in many types of processes and has found favor in the electronics industry as an efficient way of transforming an analog signal to a digital one. Such A/Ds have become especially popular in low frequency (e.g. audio) applications where an increase in sampling frequency can easily be accommodated.

Figure 26A:
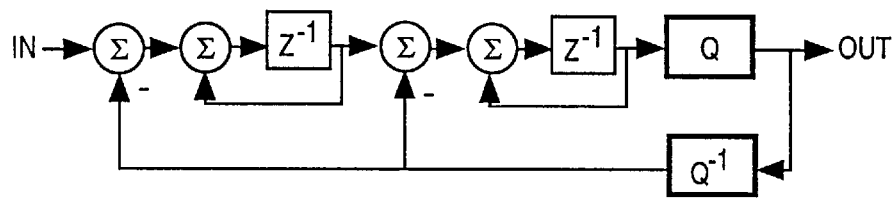
FIGS. 26A–C depicts delta-sigma converters of FIG. 3 under alternate embodiments.

In addition to the one bit quantizer at the output, the $\Delta\Sigma$ A/D 24 also incorporates integrators (hence the sigma) and negative feedback (hence the delta) performing a modulation of the input signal relative to the digital output. These analog processing elements can be switched capacitor, continuous, or even CCD based designs. FIG. 26A shows the block diagram of a second order $\Delta\Sigma$ A/D, where $Z^{-1}$ represents a delay, Q is the quantizer, and $Q^{-1}$ is a digital to analog converter. If, for example, the analog inputs are allowed to vary between −500 mV and +500 mV, then the quantizer outputs a digital '1' if the voltage at its input is greater than or equal to 0 v, and a '0' otherwise. The $Q^{-1}$ stage feeds back a −500 mV or +500 mV if the output is '0' or a '1', respectively.

The overall effect of the $\Delta\Sigma$ A/D 24 is to shape the quantization noise so that most of its power lies well outside the bandwidth of the input signal. The input signal, however, passes through the A/D unaltered. For large oversampling ratios, very little quantization noise is within the band of the input signal. A final multi-bit representation of the signal is reconstructed by passing the bit stream through a low-pass filter cutting off the quantization noise. Decimating the signal is subsequently possible.

The application of a $\Delta\Sigma$ A/D 24 to an ultrasound beamforming circuit is intuitively straightforward. Replacing the multi-bit A/D with a $\Delta\Sigma$ A/D 24 reduces all downstream processing element bit-widths by eight to ten bits, yielding a substantial reduction in size and power consumption. The difficulty is that the sampling frequency must be 16–32 times faster than that of a multi-bit A/D. For ultrasonic frequencies this oversampling results in a clock frequency well above 100 MHz, which in some technologies may be difficult to accommodate. One consequence, however, is that dynamic delay changes necessary for maintaining an in-focus receive beam can be easily implemented. Simply repeating or dropping a sample, or inserting a zero after a particular sample offsets the data stream by one clock period, which is sufficient for high quality beam steering and dynamic focusing. Equivalent delay resolution in traditional multi-bit A/D systems requires power consuming hardware including complex filters, FIFO memories, decimators, and phase rotators for every channel. Consequently, the ΔΣ beamformer is likely to reduce power consumption and size drastically.

Using real ultrasound data collected in the Biomedical Ultrasonics Laboratory at the University of Michigan, the original ΔΣ beamformer proposed by GE in U.S. Pat. No. 5,203,335 was emulated. Other possible beamforming structures using oversampling were also investigated. It was found that the structure proposed by GE suffers from a flaw that significantly reduces image quality. This flaw is a direct result of dynamically changing delays during receive beamforming. More specifically, the repeated sample in the bit stream when a delay is incremented introduces additional noise over the signal passband that cannot be removed by the reconstruction filter.

Figure 27:
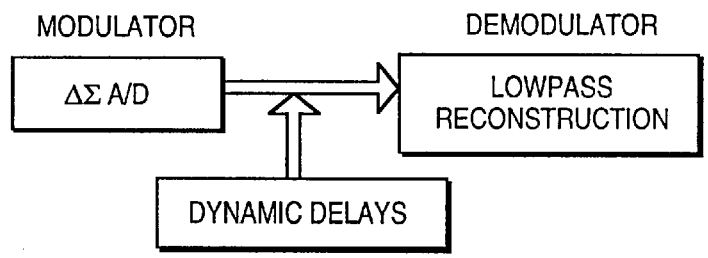
FIG. 27 illustrates delays (and repeated samples) interposed between modulator and demodulator of FIG. 3.

The ΔΣ A/D and low pass reconstruction filter shown in FIG. 27 constitute a modulator—demodulator pair. Although linear time invariant systems can be inserted between the modulator and demodulator without deleterious effects, a nonlinear operation such as repeating a sample can disrupt synchronization between modulator and demodulator. Under normal operation, running differences in the modulator are canceled within the demodulator filter, thus producing a faithful representation of the input. By inserting an extra sample (or withdrawing a sample), demodulator filter nodes no longer match those used by the modulator to generate the intervening signal. As a result, the filter corrupts the output signal by passing some of the unexpected energy.

This problem can also be considered an intermodulation corruption. Much of the power in the ΔΣ modulated signal lies near the Nyquist frequency. The input signal, however, lies close to DC due to oversampling (the actual DC value is zero). When a sample in the modulated signal is repeated the average (DC frequency) of the sample stream is offset. Since the passband of the demodulation/reconstruction filter includes DC, some of this power passes to the output of the demodulator. That is, some signal power at higher frequencies folds back into lower frequencies.

Simulations conducted on real ultrasound data indicate that filtering the modulated signal prior to repeating a sample reduces the degrading effects of delay changes. Very complex filters are required to eliminate much of the modulation noise; in a sense, this is like moving the demodulator so that it precedes delay changes. This defeats the entire purpose of performing the modulation because the demodulator output is a multi-bit digital signal running at very high speed. The primary innovation of the GE patent was to implement all delays and sums using only single-bit digital values.

Figure 26B:
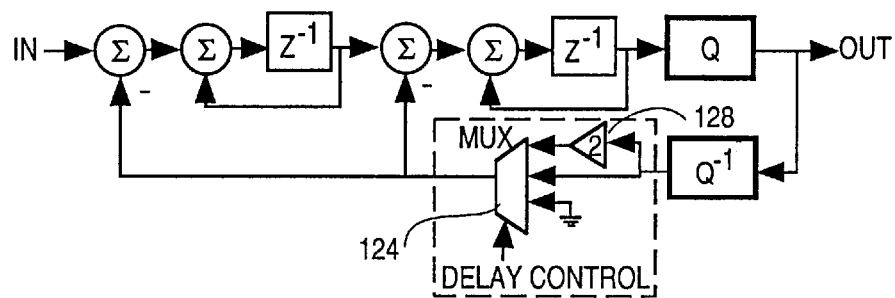

Simply stated, the modulator and demodulator are transiently unsynchronized by introducing a repeated sample, where the demodulator sees the repeated sample, but the modulator does not. The simple solution, disclosed here for the first time, is to force the modulator to take the repeated (or dropped) sample into account in its operation, and therefore in the modulation of the ensuing sample stream. To do this a multiplexer is inserted in the feedback loop that chooses between a zero, normal or scaled-by-two magnitude. Samples later repeated in the delay structure should have a feedback magnitude of two because each sample is encountered twice at the demodulator. Those samples dropped within the delay structure should have a feedback magnitude of zero because they will never be seen by the demodulator. Finally, normal, nonrepeated samples should have a feedback magnitude of one. This type of modulator that includes the feedback multiplexer 124, as shown in FIG. 26B, will be referred to as a compensated delta-sigma modulator.

Figure 26C:
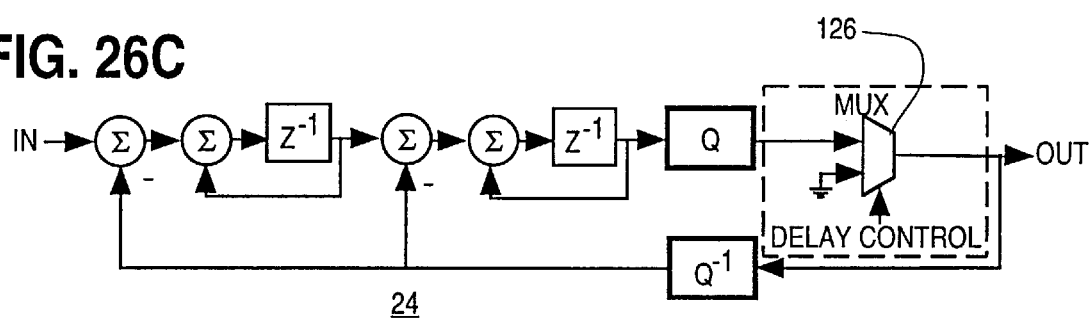

There are three ways of stretching the sample stream in the delay structure 34: repeating a sample, splitting it into two equal parts, or inserting a zero sample. For the cases where the sample is split into two equal parts or a zero is inserted, nothing should be done within the modulator to compensate the sample series. This is because nothing was done to affect the average signal power or distribution so the modulator and reconstruction filter stay synchronized. In contrast, repetition of a sample yields two samples of the same magnitude and the modulator must be compensated for the repetition. Similarly, there are two ways of compressing the sample stream: dropping a sample or summing it with the next sample. In both cases setting the output and feedback sample to zero, as shown in FIG. 26C, correctly compensates the modulator and allows samples to be summed together in a straight forward manner. Dropping a sample is analogous to double incrementing a read pointer on a FIFO, where the value of the dropped sample does not matter. The structure 126 in FIG. 26C sets the dropped sample to zero; however, only the feedback path needs to be modified as in FIG. 26B because the sample to be dropped can be anything. The highlighted areas in FIGS. 26B and 26C contain the multiplexer 124, 126 and 2× buffer 128 and are the primary innovations of this compensated delta-sigma modulator.

The alternative methods for stretching the sample stream require dividing a sample into two equal samples or inserting a zero (null) sample. Both of these techniques are effective because they preserve the synchronization between the uncompensated ΔΣ modulator and demodulator. The insert-0 technique inserts a sample into the stream that is approximately equal to the average of all the +1 and −1 samples around it, and therefore doesn't corrupt the reconstructed signal. The divide-by-2 technique spreads a modulated sample out over two new samples and thus preserves the total energy of the original signal. Both of these techniques (also referred to in this disclosure as fill-bit techniques) require digital recoding of the delayed ΔΣ samples to accurately represent the new levels. Adding a third level, zero (0), requires only one more bit in the digital word. The extra bit may be used to synthesize two different, yet equivalent, binary encodings shown below:

| ΔΣ binary output | Digital level |
|---|---|
| 1 | +1 |
| 0 | −1 |

→

| ΔΣ binary output | Digital level | New coding Unsigned | New coding Signed |
|---|---|---|---|
| 1 | +1 | 10(2) | 01(1) |
| 0 | −1 | 00(0) | 11(−1) |
| new level | 0 | 01(1) | 00(0) |

The divide-by-two technique, however, requires two additional bits because of the position of these new levels between the +1 and −1 levels. An example of this coding is shown below:

| ΔΣ binary output | Digital level |
|---|---|
| 1 | +1 |
| 0 | −1 |

| ΔΣ binary output | Digital level | New coding Unsigned | New coding Signed |
|---|---|---|---|
| 1 | +1 | 100(4) | 010(2) |
| new level | +0.5 | 011(3) | 001(1) |
| new level | −0.5 | 001(1) | 111(−1) |
| 0 | −1 | 000(0) | 110(−2) |

Schematics for these four recoding techniques are shown in FIG. 38A–D. Because of its simplicity and equivalent performance the unsigned insert zero technique is the preferred method of changing the dynamic receive delay in a digital ΔΣ based beamformer. Also, due to the bit growth it is better to perform the delay change (slip) at the output of the delay line so that the extra bit does not need to be carried through the structure. For a possible CCD implementation, the zero sample could be a constant analog voltage sample half-way between the +1 and −1 levels and the divide-by-two technique can easily be done using a charge splitting structure.

All of these methods (compensated ΔΣ, insert-0, and divide-by-2) vastly improve the quality of the final images by ensuring that the modulator and demodulator remain synchronized on either side of the time variant delay change in the dynamic receive beamformer. Although simple, the effects of this modification are significant.

The nature of the delay line, as discussed in section III.3, greatly affects the method by which the sample stream can be easily manipulated. The complementary delay line for instance is designed to repeat a sample to increase the delay, so inserting a zero or dividing the two samples in half can only be done as a post-delay processing step with complex timing constraints. Other structures like the segmented hex-tree naturally allow for injecting zeros into the sample stream at the output. CCD as opposed to CMOS digital implementations can perform the divide-by-two method simply by dividing the charge packet into two, whereas the CMOS implementation requires more bits to represent added levels.

IV.4. Premodulator

Figure 28:
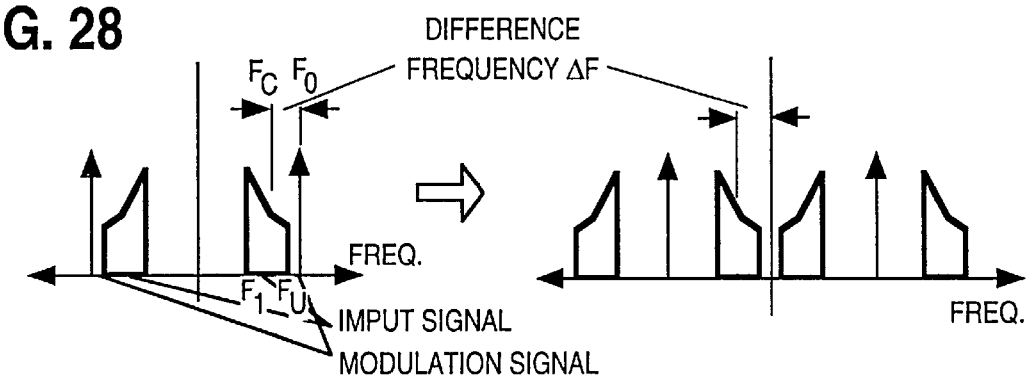
FIG. 28 depicts the operation of the premodulator of FIG. 3 showing a multiplication of an ultrasound signal and a cosine of the signal to yield a duplicated and shifted spectrum.

It has been determined that there are three ways to improve the signal to noise performance of delta-sigma modulators. The first is to increase the sampling rate of the system. Though conceptually straightforward, a substantial increase in sampling rate can be difficult given a particular microcircuit fabrication technology (e.g. CMOS, BiCMOS, Bipolar, etc . . . ). The maximum operating frequencies of each technology are limited by intrinsic device characteristics. This means there is a limit to how fast delta-sigma modulators can operate. The second method adds more resolution bits to the quantizer, which complicates modulator design. More than two quantization levels within the modulator (or more specifically of the D/A converter=$Q^{-1}$ within the feedback path) often requires extreme measures to compensate for microcircuit mismatch. The third method changes the frequency of the signal being digitized. If the signal is band limited to frequencies near the central frequency of the carrier, then the signal can be heterodyned (shifted in frequency) to a lower intermediate frequency (IF). Modulation can be accomplished with a multiplicative cosine signal, as shown in FIG. 28.

Multiplication in the time domain represents a convolution in the frequency domain. Therefore, multiplying the input signal by a cosine replicates signal bands about each of the cosine frequency components. If the cosine modulator has a frequency $f_0 = f_C + \Delta f$, where $f_C$ is the signal center frequency and $\Delta f$ is the difference frequency, then the new signal bands will be swapped and shifted versions of the previous ones. Note that as long as the difference frequency $\Delta f$ is greater than ½ the bandwidth of the signal, then the sidebands will not intermingle near zero frequency (DC). Invoking superposition, the ultrasound signal can be thought of as a single frequency, and the modulation written in mathematical terms is:

$$S(t) = \cos(\omega_0 t) \cdot A(t) \cos(\omega_C t) = \tfrac{1}{2} A(t) [\cos(\omega_0 - \omega_C) t + \cos(\omega_0 + \omega_C) t] \quad (13)$$

where $A(t)$ is the pulse envelope and $S(t)$ is the resulting modulated signal. The Fourier Transform of this function is:

$$S(\omega) = A(\omega) \otimes [\delta(\omega + \omega_C - \omega_0) + \delta(\omega - (\omega_C - \omega_0)) + \delta(\omega + \omega_C + \omega_0) + \delta(\omega - (\omega_C + \omega_0))]. \quad (14)$$

Carrying out the convolution ($\otimes$) we get:

$$S(\omega) = A(-(\omega_C - \omega_0)) + A(\omega_C - \omega_0) + A(-(\omega_C + \omega_0)) + A(\omega_C + \omega_0). \quad (15)$$

The resulting signal, therefore, is composed of two identical spectra, one shifted up in frequency by $\omega_0$, the other shifted down by $-\omega_0$. Subsequent basebanding and filtering of the shifted negative sideband is equivalent to basebanding and filtering the original positive sideband.

Applying this frequency shift technique at the input of a delta-sigma modulator 24 would effectively increase the signal to noise ratio of the system. After pre-modulation (as we will call it so as not to be confused with delta-sigma modulation), sidebands of the real signal lie near DC, where the noise shaping of the delta-sigma modulator is most effective at reducing quantization noise.

Implementing accurate cosine multiplication requires significant hardware. For simplicity, the cosine signal may be replaced by a square wave signal oscillating at the same fundamental frequency so that multiplication now involves a +1 or −1 scaling of the input. Such premodulation produces the same modulation at the fundamental frequency, but also includes smaller components from the $3^{rd}$, $5^{th}$, $7^{th}$, etc . . . harmonics. Because of these harmonics, power is injected into the signal at very high frequencies which may force the delta-sigma modulator into a quasi-stable limit cycle. In actual implementation, however, practical limits on analog processing elements will reduce the significance of higher order harmonics due to the natural rolloff of gain with frequency.

Figure 29:
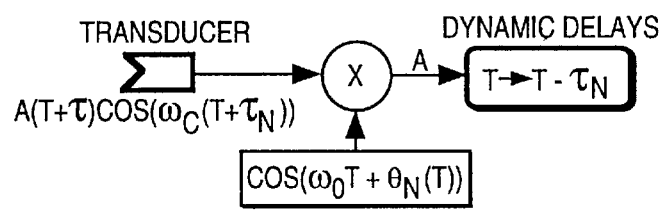
FIG. 29 depicts a schematic of the premodulation scheme of FIG. 3.

The beamformer typically generates a dynamic receive focus by changing delays applied to the output signal of the A/D prior to coherent summation across the array. Spectral Doppler measurements are the only exception to this, where the beamformer operates at a fixed receive focus because Doppler signals are interrogated within a small range. The normal operating mode, however, with dynamic delays applied to the output of the A/D requires that the premodulation signal (+1,−1s) be changed to adjust the phase of the carrier appropriately. As an example, consider the simplified case where our signal of interest (input to the system) is a cosine signal with an arbitrary phase, as shown in FIG. 29. Mathematically, the signal prior to the dynamic delay at A is given by:

$$A(t+\tau_n) \cos(\omega_C(t+\tau_n)) * \cos(\omega_0 t + \theta_n(t)). \quad (16)$$

If $\theta_n(t) = \omega_0 \tau_n$, this reduces to $$[A(t+\tau_n)/2][\cos((\omega_C - \omega_0)(t+\tau_n)) + \cos((\omega_C + \omega_0)(t+\tau_n))]. \quad (17)$$

The ($\omega_c+\omega_0$) term is at a high frequency and will be removed by the reconstruction filter. The signal of interest entering the delay line is:

$$(A(t+\tau_n)/2) \cos((\omega_c-\omega_0)(t+\tau n)). \quad (18)$$

This shows that after applying the delay (i.e. t→t−$\tau_n$) the signal output to the sum will be an unshifted cosine signal at the difference frequency and all the channels will constructively interfere to generate a focus. By choosing the modulation signal to be $$\cos(\omega_0 t+\omega_0\tau_n), \quad (19)$$

we have compensated the phase of the delay line input signal for a simultaneous delay change. Thus, when the delay line changes the applied delay by one sample ($\tau_n$), the premodulator must advance the phase of the signal multiplying the input by $\omega_0\tau_n$.

In our simplified modulation scheme, the same phase advance principles apply. Therefore, the +1,−1 modulator phase will have to take into account both the initial delay of the channel as well as the ever changing delay due to dynamic focusing. By presetting a divide by N counter with a value corresponding to the desired phase of the modulator, this can easily be done. The counter will run at the sampling frequency and change the state of the modulator every $f_s/(2f_0)$ clocks, where $f_s$ is the sampling frequency and $f_0$ is the modulation frequency. When a delay change of one sample is indicated by the control circuitry, the divide by N counter must increment twice in one cycle. Since the delay line is repeating a sample on every delay change, it is reasonable that the modulator would counteract this by making the +1,−1 or −1,+1 transition sooner. These two activities cancel out, leaving the modulation signal unchanged beyond the delay line.

Figure 30A:
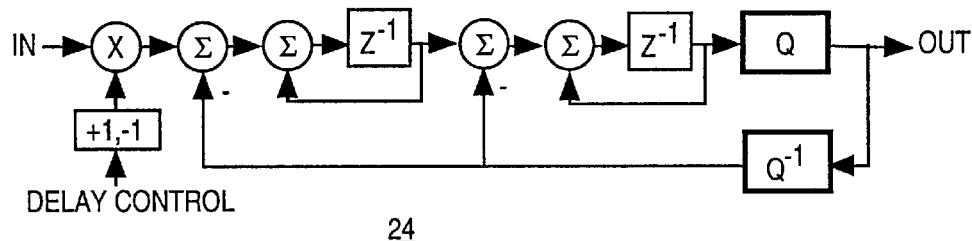
FIGS. 30A–B depicts delta-sigma modulators of FIG. 3 under alternate embodiments.
Figure 30B:
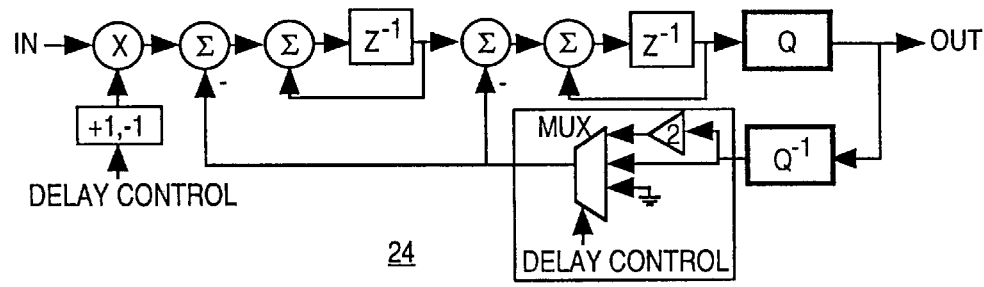

Combining this premodulation scheme with the previously disclosed delta-sigma modulator creates the circuit shown in FIG. 30. The premodulator may be unnecessary if the sample rates of the delta-sigma modulator and analog front-end are high enough. Here again there is a tradeoff between power and circuit complexity; by including the premodulator the circuit becomes more complex, however, the power consumption decreases because of the lower clock rates of the delay stages. These tradeoffs will be scrutinized in preparing a final design.

IV.5. Dynamic Receive Apodization

The delays applied to receive data follow a parabolic approximation valid whenever the range to the focus is about two times larger than the aperture used to form the beam. This minimum f/number criterion restricts the number of receive elements for foci very close to the array surface. Dynamic apodization is the process of gradually opening the receive aperture as a function of (focal) distance from the active array surface. The receive beam will start with only a few central elements contributing to the coherent summation. The others will be turned off until such time (range) as they meet the f/number criterion. Elements will be turned on symmetrically, i.e. two at a time, about the array center.

Due to the discrete nature of the delta-sigma modulator output (a single bit output representing a +1 or −1), simply zeroing the output of the A/D requires the addition of a second bit to every sample to represent the third (0) level. It was also found that within low echogenic areas of the image switching artifacts appeared as channels were turned on. Zeroing the output of the modulator did not allow the reconstruction filter to develop the same sample history as the modulator feedback, and consequently a glitch occurred. This is exactly the same principle motivating the compensated $\Delta\Sigma$ modulator (section IV.3). There are three roughly equivalent solutions to this problem that produce glitchless apodization of the receive aperture.

The first multiplexes a zero input to the delta-sigma modulator (and/or the optional premodulator) rather than the RF signal from the element. When the element is turned off, the modulator digitizes a zero level as a +1 and −1 sample series. This is advantageous because the $\Delta\Sigma$ output is still only one bit (i.e. the datapath doesn't need to change) and there is no startup glitch.

The second method uses the included premodulator to shift the frequency of the input signal to the Nyquist ($\pi$) frequency so that it lies well outside the passband of the reconstruction filter. This effectively eliminates the signal from the coherent sum without the addition of any extra analog circuitry. The frequency is shifted to Nyquist simply by setting the premodulation series to +1,−1,+1,−1,etc . . . When the element turns on, the previously described premodulation series is applied or a +1 (pass) weighting is applied if premodulation isn't used.

The third and final method modifies the output of the modulator so that it is zero and also disconnects all feedback paths (integrators and $Q^{-1}$) within the modulator itself. This sets the modulator output to zero when the element is off and prevents the modulator from developing a sample history within its storage nodes. This method has the distinct disadvantage of requiring an extra bit in the output for the zero level and adds considerable circuit complexity (and possibly noise) to the modulator since all of the feedback paths must be disableable.

IV.5. Premodulator, Apodizer, Modulator Review and Implementation

Sections IV.3–IV.5 presented detailed descriptions of the delta-sigma modulator, the premodulator, and methods of performing receive apodization. It should be clear from these discussions that they are closely related and in some ways form a single functional element, namely an oversampled A/D converter 24 with an enable. Some details needed to implement these elements will be discussed in this section. These issues, in particular switched capacitor versus continuous time implementations, include their own set of tradeoffs which must be evaluated to determine the most suitable technique for this application.

Figure 31:
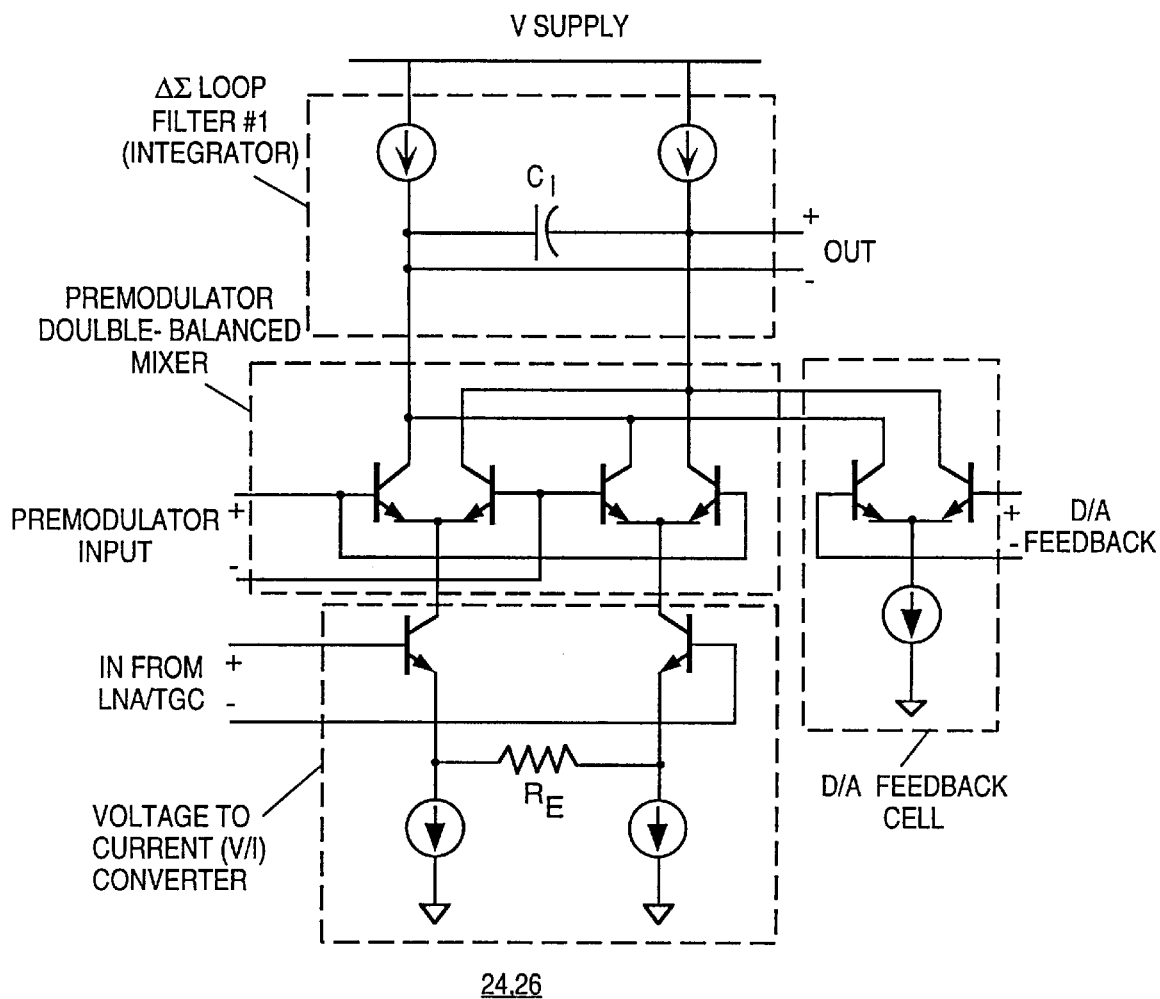
FIG. 31 depicts a schematic of the circuits shown in FIG. 30 where the premodulator and delta-sigma modulator integrator and feedback are integrated into a single cascade of analog circuits.

FIG. 31 shows a candidate schematic of the premodulator and $\Delta\Sigma$ difference/integration stage. The premodulator is implemented using a double-balanced mixer that steers current down one leg or the other of the structure. The D/A feedback from the $\Delta\Sigma$ modulator, as shown in FIG. 30, adds current to one leg or the other from the D/A feedback cell forming the difference operation. The capacitor, $C_I$, integrates current between each leg (the integrator loop in FIG. 30) and completes the first stage of the $\Delta\Sigma$ modulator with a voltage output. Additional difference/integration stages and a master/slave comparator will complete the modulator. The apodization function can be accomplished using either a +1,−1,+1,−1 premodulator sequence, as described in the previous section. Alternatively, an effective 0 can be applied by driving both of the differential premodulator inputs with the same DC signal.

IV.6. S:P, Dynamic Delays, and Fill Bit Circuits

The single bit output of the oversampled A/D 24 is passed through a 1:16 serial to parallel converter 28, discussed in section fi.3.A, to reduce the clock rate of the dynamic and fixed delay structures 34, 40. However, the preferred embodiment is the barrel shift technique of section III.3.6 because it can use a low-power, high density dynamic FIFO for the 16 parallel bits (plus one bit for the bump flag). Also as discussed in section III.3.6.1 the fill-bit recoding is only done on one of the 16 samples, so the other 15 samples can be processed as normal up to the output of the beamformer. A smaller datapath for those 15 samples results.

The fill-bit circuit is also controlled during transmit to insert all zeros into the elevational adders so that the receive path through the static delays is primed with zeros by the time the channel turns on for receive. This may also reduce delay line switching noise that could be picked up in the analog front-end. Since all storage nodes are constant, there will be very few dynamic power rail spikes that would otherwise be caused by many CMOS devices switching on clock edges.

IV.7. Elevational Sums

The elevational sum will be implemented in CMOS circuits; however, a CCD implementation could perform the sum simply by pooling together quantized "packets" of charge from each elevational channel. The CMOS additions may be done in parallel and pipelined fashions. For a 320 MHz Rx sample rate there are eight two-bit elevational channels that must be added together in a short 3.13 ns clock cycle time. Seven or eight sequential additions may require too many levels of logic for all additions to be done in one cycle. As a result, the adders may have to be pipelined, where partial sums would be calculated in one cycle and then a final addition in a second cycle would complete the operation. Fortunately, as microcircuit fabrication technology improves the gate delays of the logic are reduced, reducing reliance on pipelining. Also, for most CMOS adders the carry chain (the carry from one bit addition to the next) is the critical path; however, for this implementation the words are short, so the carry chain is short and fewer levels of logic are needed. Device specifics of the final product will determine whether these additions can be done in one cycle or two (or more).

IV.8. Comb Filter and Decimate

An optimal decimation stage may follow the elevational sums 38 to reduce the clock rate of the data through the fixed delay lines. A similar decimation satge 50 at the output of the beamformer 10 may also be included. This decimation requires a multi-order comb (sinc) filter to prevent aliased delta-sigma modulated noise from entering the signal. Considerable literature exists that describes different structures performing this filter-decimate function (see "Oversampling Delta-Sigma Data Converters" by Candy and Temes, or "Delta-Sigma Data Converters" by, Norsworthy, Schreier, and Temes both from IEEE Press). The structure to be used here exploits the modulo arithmetic provided by two's complement binary notation. The processing elements will consist of several adders arranged in up to four cascaded filters ($4^{th}$ order) followed by a 4:1 to 16:1 decimation stage, depending on the receive sampling rate. The output word width is considerably larger than the input word width (4–5 bits/word) due to the number of additions performed. The output word width is a function of the order of the filter applied as well as the decimation ratio from input to output.

Instead of filtering and decimating the 4 bit elevational sum outputs, another serial to parallel operation can be performed under an alternative embodiment that creates a very wide word delayed using the slower clock. The power consumed by the additional storage elements needed for this parallelized structure is more than would be necessary had the decimation been performed. Offsetting this, however, is the absence of the filter decimate structure which can consume significant power due to its high operating speed.

IV.9. Fixed Delay

The fixed delay line 40 was described in section III.3. Its operation on receive is exactly the same as on transmit. It maintains constant delay during a beam, but may change from firing to firing or from receive to transmit.

IV.10. Azimuthal Sum

In comparison to the elevational sum, the azimuthal sum has significantly more time to perform additions. However, the number of bits on each input is much larger (13–20 bits) and there are many more inputs (64 azimuthal channels). As a result, this operation likely spans several clock cycles for each output sample (pipelining). The size and layout of the structure 46 is also a contributing factor to its delay. It takes at least six levels of binary adders (32, 16, 8, 4, 2, and 1, 2-input adders) to successfully sum all 64 azimuth channels. Depending on the number of channels per chip, only a few azimuth sums may take place on any one chip. Passing the result from one chip to the next in a pipelined fashion will complete the sum.

Inputs to all adders will be set to zero during transmit to reduce power consumption and power rail noise. Since the adders are not used during transmit, it would be advantageous to power down that part of the circuit; however, setting all the inputs to zero accomplishes much the same thing. When each channel turns on for receive, fixed delay data enters the adders.

IV. 11. Bump Clock Generator

In sections III.3. and IV.6. the "bump" clock 30 was defined as the control signal dynamically changing receive delays by one quanta. A simple state machine similar to the one developed by General Electric provides the bump at the appropriate times. The GE design is described in U.S. Pat. No. 5,111,695 by Engeler, O'Donnell, Pedicone, and Bloomer, issued on May 12, 1992 is incorporated herein by reference. Using only a few variables and simple arithmetic operations, the finite state machine calculates the time for each bump relative to the previous one. It is clocked at a rate determined by the minimum f/number of the system (typically $\frac{1}{64}^{th}$ the data sampling rate), where output bumps follow a 1/range relation. (The f/number is defined as the focal distance divided by the aperture width.) The GE bump algorithm was developed for 1D transducer arrays ; however, it only depends on the distance from an element to the center of the array and the fixed steering angle of the beam. As such, it is equally suitable for 2D arrays of arbitrary geometry. Delays related to steering angle and array curvature are constants for each beam, and are computed by off-chip controllers (i.e. the front end controller and its memory, see FIG. 1).

A similar technique has been developed that does not require the ratio of sampling and range clocks to be a function of the minimum f/number of the system. This modified technique is described in the following paragraphs. It will later be contrasted with the patented GE method to illustrate the differences.

The delay for each transducer element relative to the geometrical center of the array can

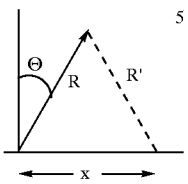

$$t(x) = \frac{R' - R}{V_s}, \quad (20)$$

where $$R' = \sqrt{x^2 + R^2 - 2Rx\sin\theta}$$

using the law of cosines (with cos (90−Θ)=sin (Θ)), x is the distance of the element to the array center, R is the range from the array center to the point of interest, and $V_s$ is the speed of sound in tissue. Equation (20) simply represents the propagation time difference from the array center to a point, relative to a particular element's propagation time to that same point. The delay can be rewritten using a parabolic approximation (only the first two terms) in a Taylor Series expansion to yield the familiar expression for a linear 1-D array:

$$t(x) = \frac{-x\sin\theta}{V_s} + \frac{x^2\cos^2\theta}{2RV_s}. \quad (21)$$

The first term steers the beam to some angle θ relative to the array normal, and the second term focuses the array as a function of 1/range. The steer term is constant for a fixed beam angle. For other array geometries, such as the curved array presented in this disclosure, there can be a static delay related to both beam angle and array geometry. In any event, the static term is controlled separately and is not part of the dynamic bump generator.

Two clocks are used for dynamic focusing. The first is obviously the sample clock, with period $\Delta t_\phi$, representing the delay resolution of the structure (i.e., bumping the delay changes the time through the structure by one sample). The second clock is a fixed range clock whose period, $\tau_R$, is chosen for simplicity to be a power of two multiple (e.g. 16 times) of the sample clock. $\tau_R$ represents the time (range) between focal updates, It should be short enough to keep the receive aperture properly focused.

Range can be written in terms of the range clock as: $2R=V_s n \tau_R$. Substituting this into Eq. 21, and ignoring the steer term, we get:

$$t_{focus} = \frac{x^2\cos^2\theta}{V_s^2 n \tau_R}. \quad (22)$$

Writing this in terms of the sample clock, so that $t_{focus} = k_{fous}\Delta t_\phi$, we have:

$$k_{focus} = \frac{x^2\cos^2\theta}{V_s^2 n \tau_R \Delta t_\phi} = \frac{\Gamma}{n}, \quad (23)$$

where $$\Gamma = \frac{x^2\cos^2\theta}{V_s^2 \tau_R \Delta t_\phi} \quad (24)$$

is a constant in terms of sample clock ticks, and n is an integer representing the number of sample clock cycles since range zero (i.e., R=0). Once the transducer launches a pulse into tissue, the central elements turn on to receive echoes. As the pulse propagates further into tissue, more elements turn on according to a constant f/number criterion (f/number=R/ (2|x|)) because the parabolic approximation used to derive Eq. 21 is only valid for f/numbers greater than or equal to about 2.0. Alternate strategies can be used to turn on the elements. Each channel turns on at an independent range $R_o$, ($R_o = V_s n_o \tau_R / 2$) such that $$k_{turnon} = \frac{\Gamma}{n_o} = \phi, \quad (25)$$

where $n_o$ is the turn-on count in terms of range clock ticks, and φ is the sample delay at turn-on.

Eqns. 25 & 23 present all focusing delays in terms of sample clock ticks at turn-on and for every range thereafter, respectively. Because the delay can only change by integer multiples of a clock period, it must change (bump) by one $\Delta t_\phi$ increment when the difference between the turn-on delay ($k_{turnon}$) and the current delay ($k_{focus}$) is an integer (i.e. $k_{turnon} - k_{focus} = j$, where j is an integer). Writing this explicitly, $$\frac{\Gamma}{n_o} - \frac{\Gamma}{n_o + \Delta n} = j \Rightarrow \frac{\Gamma}{n_o}\Delta n = j(n_o + \Delta n), \quad (26)$$

where $n=n_o+\Delta n$, and Δn is the number of range clock ticks from turn-on. Noting that $\Gamma/n_o = \phi$, Eq. 26 becomes:

$$0 = jn_o + j\Delta n - \phi\Delta n. \quad (27)$$

Figure 39:
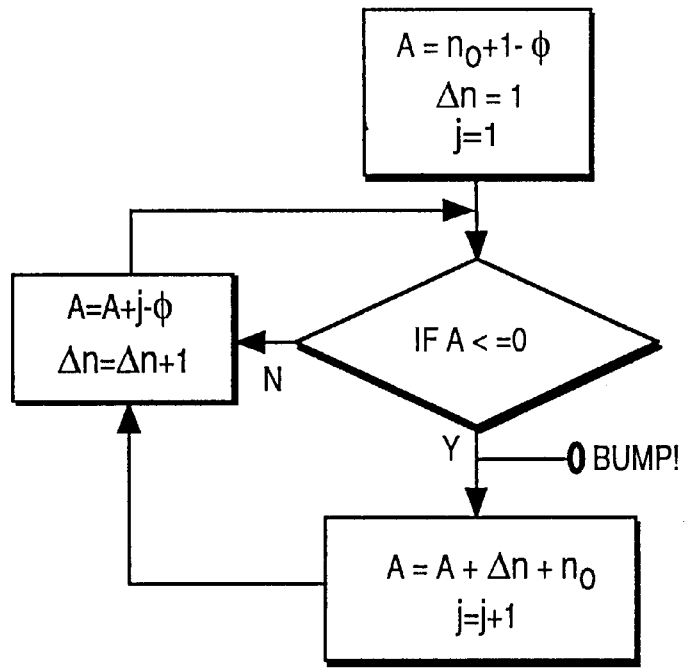
FIG. 39 is a bump clock algorithm flow chart for the bump clock generator of FIG. 3.

A simple state machine 30 can be constructed to solve this equation by noticing that Δn is a counter starting at $n=n_o$ and j is a counter accumulating bumps as a function of range. Δn increments on every range clock tick, and j increments every time the right side of Eq. 27 is negative, i.e. when the delay is changed (bumped). The algorithm shown below and presented pictorially in FIG. 39 solves this equation keeping the right side close to zero. Several fixed point arithmetic operations are required during every range clock cycle; however, the range clock is slow enough compared to the sample clock that this is not a problem.

Bump Clock Algorithm:

-continued

Load: $\phi, n_o$

Init: $A = n_o + 1 - \phi$ $\Delta n = 1$ $j = 1$

Loop: If $A <= 0$ $A = A + \Delta n + n_o$ $j = j + 1$ (increment delay = bump)

end $A = A + j - \phi$ $\Delta n = \Delta n + 1$

This bump clock algorithm differs from the GE patented method because of two key features.

1) $n_o = 2R_o/(V_s \tau_R)$ is the only constant setting the f/number of the system. Consequently, the array can be turned on using an arbitrary algorithm, not just a constant f/number approach.

2) the ratio of the sampling clock ($\Delta t_\phi$) to the range clock ($\tau_R$) is now a constant for any operating mode. This means the range clock can be derived locally for each channel (i.e., a variable range clock does not have to be distributed about the system).

Previously the Ratios of the Clocks Assured that when $$n_o = \frac{|x|\cos\theta}{V_s\sqrt{\Delta t_\phi \tau_R}}$$

range clock cycles had elapsed, then the f/number was set appropriately. We have decoupled these issues ($n_o$ and the clock ratios) so that each can be set independently. The consequence is that $\phi$ must be included in all the calculations; however, complicated range clock generation circuitry (to provide adequate choices of clock ratios) is no longer needed.

The second claim in U.S. Pat. No. 5,111,695 states that "the channel time delay is adjusted proportional to $n_o^2/n$, where $n_o$ is the starting value of the range clock index n". This is where our system differs. The time delay is adjusted proportional to $$\frac{\Gamma}{n} = \frac{x^2 \cos^2\theta}{V_s^2 n \tau_R \Delta t_\phi},$$

but $n_o$ is now found directly from the element's position in the array and the desired f/number:

$$n_o = 4|x|(f/\text{number})/(V_s \tau_R)$$

The variables and constants used in this bump clock generator are loaded from external sources at the beginning of every beam. More precisely, they will be loaded into the chip as the receive beam is being formed and stored in temporary registers until the next receive cycle begins.

V. Multibeam Beamforming

For many applications, several simultaneous receive beams are required on each transmit cycle. This allows a larger field of view (multiple beams) to be interrogated in the same amount of time, thus improving frame rates. This is particularly useful for color flow Doppler imaging where the same beam must be repeatedly interrogated to form an accurate estimate of the blood flow in vessels. The premodulator at the $\Delta\Sigma$ input complicates a multibeam beamformer because the initial phase of the premodulator signal depends on the total delay applied to the signal as discussed in section IV.4. (Dynamic delay changes and resulting premodulator phase changes are not the problem because regardless of the beam angle the delay changes as 1/range. Instead, it is the different fixed delays for the different beams that cause the problem.) As a result, each simultaneous beamformer requires its own set of premodulators, $\Delta\Sigma$ modulators, dynamic delays, and static delays. If the premodulator were not used, as is likely the case for normal B-scan imaging or sonar applications, a new set of static delays would only be necessary to apply a different steering delay.

To facilitate multibeam operation (generating multiple receive beams) a fourth transducer element can be connected to each channel's azimuth mutliplexer. The left panel in FIG. 33 shows an 8EL by 8AZ beamforming chip may be used for normal imaging modes with a 2D array of transducers. The right panel in the figure has all of the azimuth channels in the fourth elevational row connected to the first stage beamformer. This allows multiple (up to 8) receive beams to be synthesized in azimuth simultaneously. The dynamic delays provide only azimuthal focus and steering delays because all beamforming is done using a single elevational row. 2D curved, flat phased, or flat linear arrays could be used in this manner provided the dynamic delays accommodate the steering delays necessary within the subaperture connected to this first beamforming stage. The static delay stages provide additional azimuthal steering components for each beam prior to a final summation. Note that from FIG. 34 that in this multibeam mode, each partial beamsum may be added with another partial beamsum generated on another chip. This complicates chip I/O because now all partial beam data must be brought in simultaneously for each of the beams, whereas before there was only one partial beam data stream to be added. The final set of adders can be multiplexed so that they perform each partial beam sum appropriately.

Although this method allows us to generate multiple receive beams, there will be only one transmit beam. This beam will be slightly wider than normal to deposit energy across the region of interest covered by the multiple receive beams. To increase the transmitted signal intensity, the entire 2D array can be used to generate the fixed focus transmit beam as in the normal imaging mode. On receive, the azimuth multiplexer will switch in the receive elevational row. This method of multibeam generation suffers from severe elevational receive beam spreading due to the small element size, since it acts as an omnidirectional receiver. The fixed elevational focus mitigates this to some extent, however, degraded far field images will likely result. If fewer, say only 2, parallel beams were needed, then a 4El×8Az array could be used on receive with the same hardware in a similar configuration which would yield better elevational beamforming performance. Other possible configurations can be easily envisioned.

Figure 40:
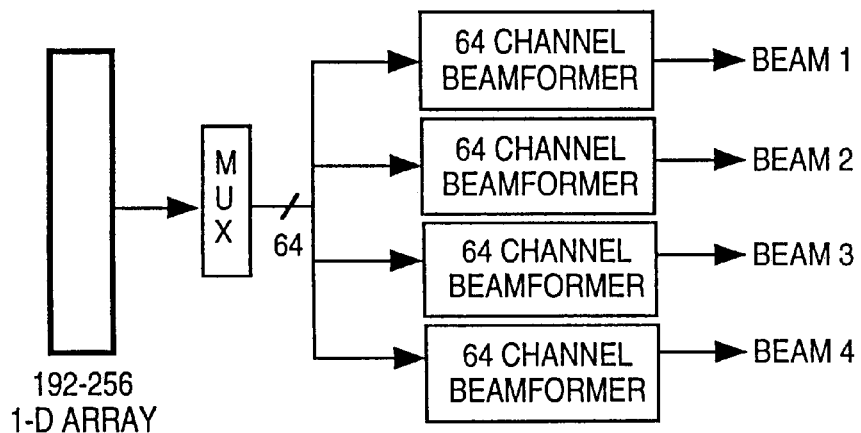
FIG. 40 depicts a block diagram of the beamformer of FIG. 3 under an alternate embodiment.

Another multibeam implementation (FIG. 40) under another embodiment is to create several complete parallel beamformers that share analog front-ends. If the high voltage drivers and analog multiplexers are integrated on a chip different from the signal processing circuits, then an unlimited number of these beamformers could share analog components and be connected on receive to the full 2D array to generate an unlimited number of beams. This is potentially very useful for sonar applications.

VI. 1D Arrays

It should be clear given the above discussion that the beamformer proposed here can easily be used with a 1D array, of arbitrary configuration. Provided that total delays are sufficient for the application, any 1D array can be connected to the beamformer.

VII. Another Stage of Delays

Flat phased arrays scan a region of interest by steering the beam through a 90 degree sector rather than stepping an active aperture across a larger physical array. The large steering delays required for phased array imaging can be partitioned so that each static delay on the beamforming chip provides just enough steering flexibility within the subaperture of the chip. A second static delay can be added to the output partial beamsum data stream to offset one chip's partial beamsum from another. The prior art has used this technique in some cases on every channel to accomplish the total delay, whereas this beamformer calculates partial beams before applying these large steering delays.

VIII. Common Mode Noise Rejection

There are several ways our system reduces EMI noise affects. Common mode noise rejection on a per channel basis and a system basis are explored in this section.

VIII.1 Differential Drive/receive

As discussed previously and shown graphically in several figures, the system described herein uses differential drive and receive circuits throughout the analog front-end including the connections to the piezoelectric transducers. The differential op-amps only amplify those signals that aren't shared between positive and negative poles. As a result, common mode noise is substantially removed by differential processing.

VIII.2 Poling and Polarity Alternation

Another common mode noise rejection technique takes advantage of the coherent summation across the array. By alternating the polarity of the connections to the transducer elements and later inverting the signal prior to the coherent summation, common mode noise components are canceled within the sum. U.S. Pat. No. 4,984,465 by J. E. Piel et al. discusses a method of using transformers with alternating windings on consecutive channels to accomplish common mode noise rejection at the system level. This method eliminates common mode noise that may have been coupled into the individual channels, including interconnect and analog processing from the point of connection to the transducer on back. The transducer itself, however, is a potential source of common mode noise, which would not be removed by alternating the polarity of its connections.

L. S. Smith, also an inventor on U.S. Pat. No. 4,984,465, later provided an approach to remove common mode noise that may be coupled into the system at the transducer. Since the piezoelectric ceramic is a relatively high impedance material, it can act as a noise source in response to an externally applied electromagnetic field. In U.S. Pat. No. 5,062,429, Smith et al. propose poling the transducer ceramic in an alternating fashion across the array. This accomplishes the same common mode rejection as previously described but also eliminates components coupled into the system at the transducer element. Accomplishing this alternating poling on a prefabricated array of transducers is difficult considering that the array must be heated past the material's Curie temperature and a very high voltage bias applied across each element. Arcing and processing irregularities are two of many difficulties produced by this approach. Instead, we propose to assemble the array in azimuthal slices, where each azimuth row would have the same poling. Therefore, pre-poled material of high quality and uniformity can be used to form each 1D azimuth array of either positive or negative polarity. These azimuth arrays will be stacked in elevation so that the polarity alternates from channel to channel. The resulting 2D array will have constant azimuthal, and alternating elevational polarity. Connections to the analog front end from row to row ensures that the ultrasound signal is coherently summed across the array whereas common mode noise is canceled.

The inverter required in either of these common mode rejection techniques is as simple as reversing the differential inputs on the last analog processing stage. Alternatively, the premodulation signal could be used to invert the signal on those channels requiring it. Or finally, the $\Delta\Sigma$ modulator output, a digital value, could be inverted for signal inversion. The later the inversion, the more chance that a common mode noise source will be rejected. Clock noise, for example, injected into the signal by the LNA, TGC, or $\Delta\Sigma$ modulator could possibly be eliminated in the final reconstruction because these noise sources would destructively add from one channel to the next.

The oversampled beamformer described in this disclosure is intended to facilitate a low-power, compact beamforming system that can be implemented in only a few integrated circuit chips and be assembled within a handheld transducer housing. The simplicity of the processing circuitry makes it ideal for this aggressive packaging paradigm. The consequence of such an implementation is that very large 2D arrays can be supported because the chips that process the signals for each channel are located only a few centimeters away. This is possible using micromachined flex-cable interconnect and multi-chip module assembly techniques to create a compact unit that can fit into a deck-of-cards sized transducer housing. Only a minimal number of high-speed digital cables are necessary to communicate the beamformed data to a host-processor for further image processing. Ultimately this communication will be handled via an RF or fiberoptic link.

A specific embodiment of a method and apparatus for forming ultrasonic images according to the present invention has been described for the purpose of illustrating the manner in which the invention is made and used. It should be understood that the implementation of other variations and modifications of the invention and its various aspects will be apparent to one skilled in the art, and that the invention is not limited by the specific embodiments described. Therefore, it is contemplated to cover the present invention any and all modifications, variations, or equivalents that fall within the true spirit and scope of the basic underlying principles disclosed and claimed herein.

We claim:

1. A method of reducing distortion in a dynamically delayed digital sample stream of an imaging system, such method comprising the steps of:

delta-sigma modulating an input analog signal of the imaging system at a frequency above the Nyquist frequency of the input analog signal to generate a digital sample stream; and changing a length of the sample stream while maintaining synchronism between a delta-sigma modulator and a demodulator of the system, thereby reducing intermodulation corruptions.

2. The method as in claim 1 wherein the step of delta-sigma modulating an input analog signal further comprises adjusting a feedback magnitude within the modulator.

3. The method as in claim 2 wherein the step of changing the length of the sample stream further comprises deleting a sample of the sample stream.

4. The method as in claim 3 wherein the step of adjusting the feedback magnitude further comprises providing a null feedback for the deleted sample.

5. The method as in claim 2 wherein the step of changing the length of the sample stream further comprises inserting another sample into the sample stream.

6. The method as in claim 5 wherein the step of inserting another sample into the sample stream further comprises repeating a sample of the sample stream.

7. The method as in claim 6 wherein the step of adjusting the feedback magnitude further comprises providing a feedback multiplier of two for the repeated sample.

8. The method as in claim 1 wherein the step of changing the length of the sample stream further comprises inserting another sample into the sample stream.

9. The method as in claim 8 wherein the step of inserting another sample into the sample stream further comprises adjusting a digital level of the delayed samples.

10. The method as in claim 9 wherein the step of adjusting the digital level of the delayed samples further comprises dividing an original sample in half to produce a pair of divided samples and substituting the pair of divided samples for the original sample.

11. The method as in claim 9 wherein the step of adjusting the digital level of the delayed samples further comprises inserting a null sample into the sample stream, where a null sample has a magnitude half way between a high and low level of the digital sample stream level.

12. Apparatus for reducing distortion in a dynamically delayed digital sample stream of an imaging system, such apparatus comprising:
  means for delta-sigma modulating an input analog signal of the imaging system at a frequency above the Nyquist frequency of the input analog signal to generate the digital sample stream; and
  means for changing a length of the sample stream while maintaining synchronism between the means for delta-sigma modulating and a demodulator of the system, thereby reducing intermodulation corruptions.

13. The apparatus as in claim 12 wherein the means for delta-sigma modulating the sample stream further comprises means for adjusting a feedback magnitude.

14. The apparatus as in claim 13 wherein the means for changing the length of the sample stream further comprises means for deleting a sample of the sample stream.

15. The apparatus as in claim 14 wherein the means for adjusting the feedback magnitude further comprises means for applying a feedback magnitude half-way between a high and low level for the deleted sample.

16. The apparatus as in claim 13 wherein the means for adjusting the length of the sample stream further comprises means for inserting another sample into the sample stream.

17. The apparatus as in claim 16 wherein the means for inserting another sample into the sample stream further comprises means for repeating a sample of the sample stream.

18. The apparatus as in claim 17 wherein the means for adjusting the feedback magnitude further comprises means for doubling a feedback magnitude for the repeated sample.

19. The apparatus as in claim 12 wherein the means for changing the length of the sample stream further comprises inserting another sample into the sample stream.

20. The apparatus as in claim 19 wherein the means for inserting another sample into the sample stream further comprises adjusting a digital level of the delayed samples.

21. The apparatus as in claim 20 wherein the means for adjusting the digital level of the delayed samples further comprises dividing an original sample in half to produce a pair of divided samples and substituting the pair of divided samples for the original sample.

22. The apparatus as in claim 20 wherein the means for adjusting the digital level of the delayed samples further comprises inserting a null sample into the sample stream, where a null sample has a magnitude half way between a high and low level of the digital sample stream.

23. Apparatus for reducing distortion in a dynamically delayed digital sample stream of an imaging system, such apparatus comprising:
  a delta-sigma modulator which modulates an input analog signal of the imaging system at a frequency above the Nyquist frequency of the input analog signal to generate the digital sample stream; and
  a sample stream controller which changes a length of the sample stream to delay a portion of the sample stream while maintaining synchronism between the means for delta-sigma modulating and a demodulator of the system.

24. The apparatus as in claim 23 wherein the delta-sigma modulator which modulates the input analog signal further comprises a feedback controller.

25. The apparatus as in claim 24 wherein the sample stream controller which changes the length of the sample stream further comprises a first programmable shift register which deletes a sample of the sample stream.

26. The apparatus as in claim 25 wherein the feedback controller further comprises an arithmetic unit which applies a feedback magnitude half way between a normal high and low level for the deleted sample.

27. The apparatus as in claim 24 wherein the sample stream controller which adjusts the length of the sample stream further comprises a second programmable shift register which inserts another sample into the sample stream.

28. The apparatus as in claim 27 wherein the sample stream controller which inserts another sample into the sample stream further comprises a memory which together with the second programmable shift register repeats a sample of the sample stream.

29. The apparatus as in claim 28 wherein the feedback controller which adjusts the feedback magnitude further comprises a feedback doubler which provides a feedback magnitude of two for the repeated sample.

30. The apparatus as in claim 23 wherein the sample stream controller which adjusts the length of the signal stream further comprises a second programmable shift register which inserts another sample to the sample stream further and a divider which divides an original sample in half to produce a pair of divided samples and substitutes the divided samples for the original sample and the inserted sample.

31. The apparatus as in claim 27 wherein the means for inserting another sample to the sample stream further comprises means for inserting a null sample into the sample stream.

* * * * *